(12) United States Patent
Fukumura

(10) Patent No.: US 10,147,738 B2
(45) Date of Patent: Dec. 4, 2018

(54) SEMICONDUCTOR DEVICE AND METHOD FOR MANUFACTURING SEMICONDUCTOR DEVICE

(71) Applicant: Toshiba Memory Corporation, Minato-ku (JP)

(72) Inventor: Tatsuya Fukumura, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 28 days.

(21) Appl. No.: 15/207,847

(22) Filed: Jul. 12, 2016

(65) Prior Publication Data

US 2017/0236834 A1    Aug. 17, 2017

Related U.S. Application Data

(60) Provisional application No. 62/296,333, filed on Feb. 17, 2016.

(51) Int. Cl.

| | | |
|---|---|---|
| *H01L 27/115* | (2017.01) | |
| *H01L 23/522* | (2006.01) | |
| *H01L 23/528* | (2006.01) | |
| *H01L 21/28* | (2006.01) | |
| *H01L 21/02* | (2006.01) | |
| *H01L 21/311* | (2006.01) | |
| *H01L 27/11582* | (2017.01) | |
| *H01L 49/02* | (2006.01) | |

(52) U.S. Cl.
CPC .. *H01L 27/11582* (2013.01); *H01L 21/02636* (2013.01); *H01L 21/31111* (2013.01); *H01L 21/31144* (2013.01); *H01L 23/528* (2013.01); *H01L 23/5226* (2013.01); *H01L 28/00* (2013.01)

(58) Field of Classification Search
CPC ......... H01L 27/11565; H01L 21/11504; H01L 27/11519
See application file for complete search history.

(56) References Cited

U.S. PATENT DOCUMENTS

| | | | |
|---|---|---|---|
| 9,412,749 B1 * | 8/2016 | Shimabukuro | ..... H01L 23/5226 |
| 2015/0214103 A1 | 7/2015 | Matsuda | |
| 2015/0221667 A1 | 8/2015 | Fukuzumi et al. | |
| 2015/0255484 A1 | 9/2015 | Imamura et al. | |
| 2017/0352678 A1 * | 12/2017 | Lu | ....................... H01L 21/4846 |

FOREIGN PATENT DOCUMENTS

| | | |
|---|---|---|
| JP | 2015-138941 | 7/2015 |
| JP | 2015-149413 | 8/2015 |
| JP | 2015-170692 | 9/2015 |

* cited by examiner

*Primary Examiner* — Matthew Reames
*Assistant Examiner* — John Bodnar
(74) *Attorney, Agent, or Firm* — Oblon, McClelland, Maier & Neustadt, L.L.P.

(57) ABSTRACT

According to one embodiment, a first semiconductor body extends in a stacking direction of a stacked body through a first stacked unit and contacts a foundation layer. A plurality of contact vias extend in the stacking direction through an insulating layer and contact a plurality of terrace portions. A second semiconductor body extends in the stacking direction through a second stacked unit. An insulating film is provided between the foundation layer and a lower end portion of the second semiconductor body.

16 Claims, 41 Drawing Sheets

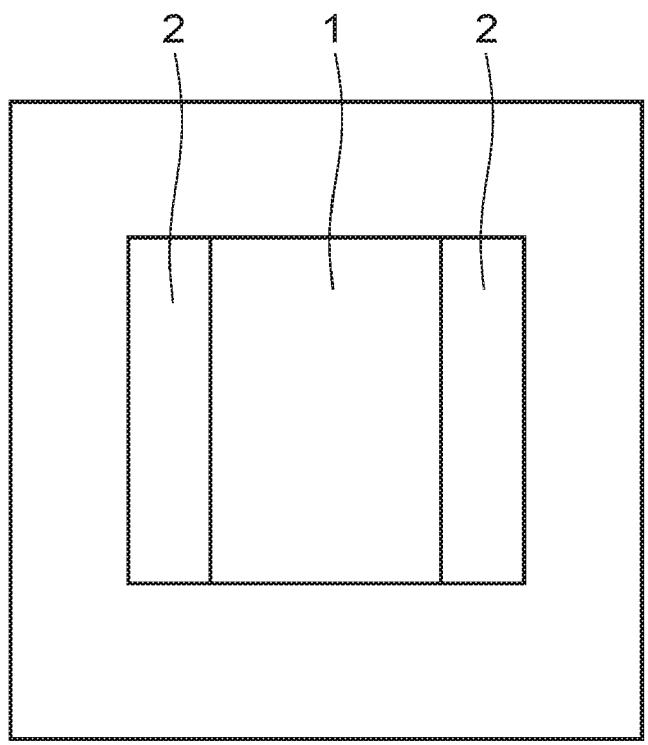
FIG. 1
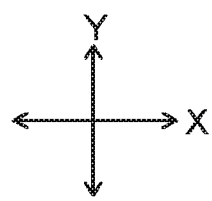

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from U.S. Provisional Patent Application 62/296,333, filed on Feb. 17, 2016; the entire contents of which are incorporated herein by reference.

FIELD

Embodiments described herein relate generally to a semiconductor device and a method for manufacturing a semiconductor device.

BACKGROUND

A structure has been proposed in which a plurality of electrode layers of a three-dimensional memory device are patterned into a stairstep configuration as a contact structure for connecting the electrode layers to a control circuit. An insulating layer is formed on the stairstep portion; and contact vias that pierce the insulating layer reach each level of the electrode layers.

BRIEF DESCRIPTION OF THE DRAWINGS

FIG. 1 is a schematic block plan view of a semiconductor device of an embodiment;

DETAILED DESCRIPTION

Figure 2:
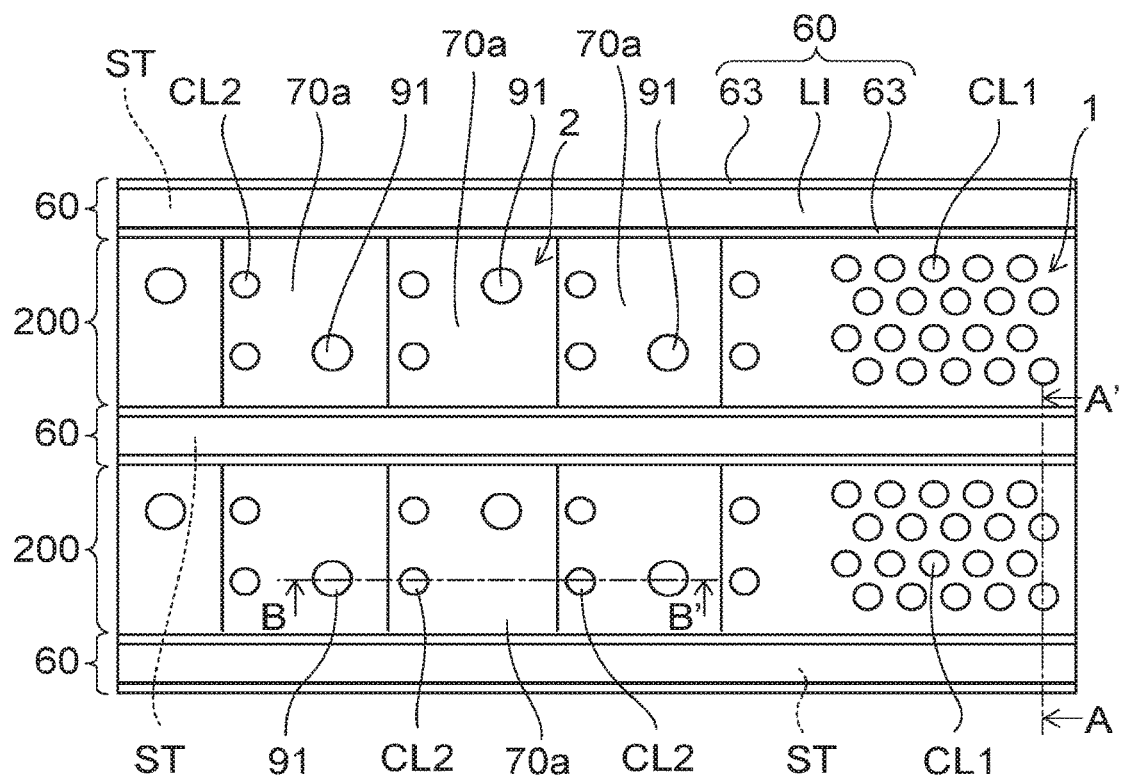
FIG. 2 is a schematic plan view showing an arrangement example of a memory cell array and a stairstep portion of the embodiment.

According to one embodiment, a semiconductor device includes a foundation layer, a stacked body, a plurality of first columnar portions, an insulating layer, a plurality of contact vias, and a plurality of second columnar portions. The foundation layer is conductive or semiconductive. The stacked body is provided above the foundation layer. The stacked body includes a plurality of electrode layers stacked with an insulator interposed. The electrode layers include a first stacked unit and a second stacked unit. The second stacked unit has a plurality of terrace portions provided in a stairstep configuration with a difference in levels in a first direction. The plurality of first columnar portions include a first semiconductor body and a stacked film. The first semiconductor body extends in a stacking direction of the stacked body through the first stacked unit and contacts the foundation layer. The stacked film is provided between the first semiconductor body and the electrode layers, and includes a charge storage portion. The insulating layer is provided above the terrace portions. The plurality of contact vias extend in the stacking direction through the insulating layer and contact the terrace portions. The plurality of second columnar portions include a second semiconductor body and an insulating film. The second semiconductor body extends in the stacking direction through the second stacked unit. The insulating film is provided between the foundation layer and a lower end portion of the second semiconductor body.

Embodiments will now be described with reference to the drawings. The same components are marked with the same reference numerals in the drawings.

For example, a semiconductor memory device that includes a memory cell array having a three-dimensional structure is described as a semiconductor device in the embodiment.

FIG. 1 is a schematic block plan view of the semiconductor device of the embodiment.

The semiconductor device of the embodiment includes a memory cell array 1, and a stairstep portion 2 provided in a peripheral region outside the memory cell array 1. The memory cell array 1 and the stairstep portion 2 are provided on the same substrate.

FIG. 2 is a schematic plan view showing an arrangement example of the memory cell array 1 and the stairstep portion 2 of the embodiment.

Figure 3:
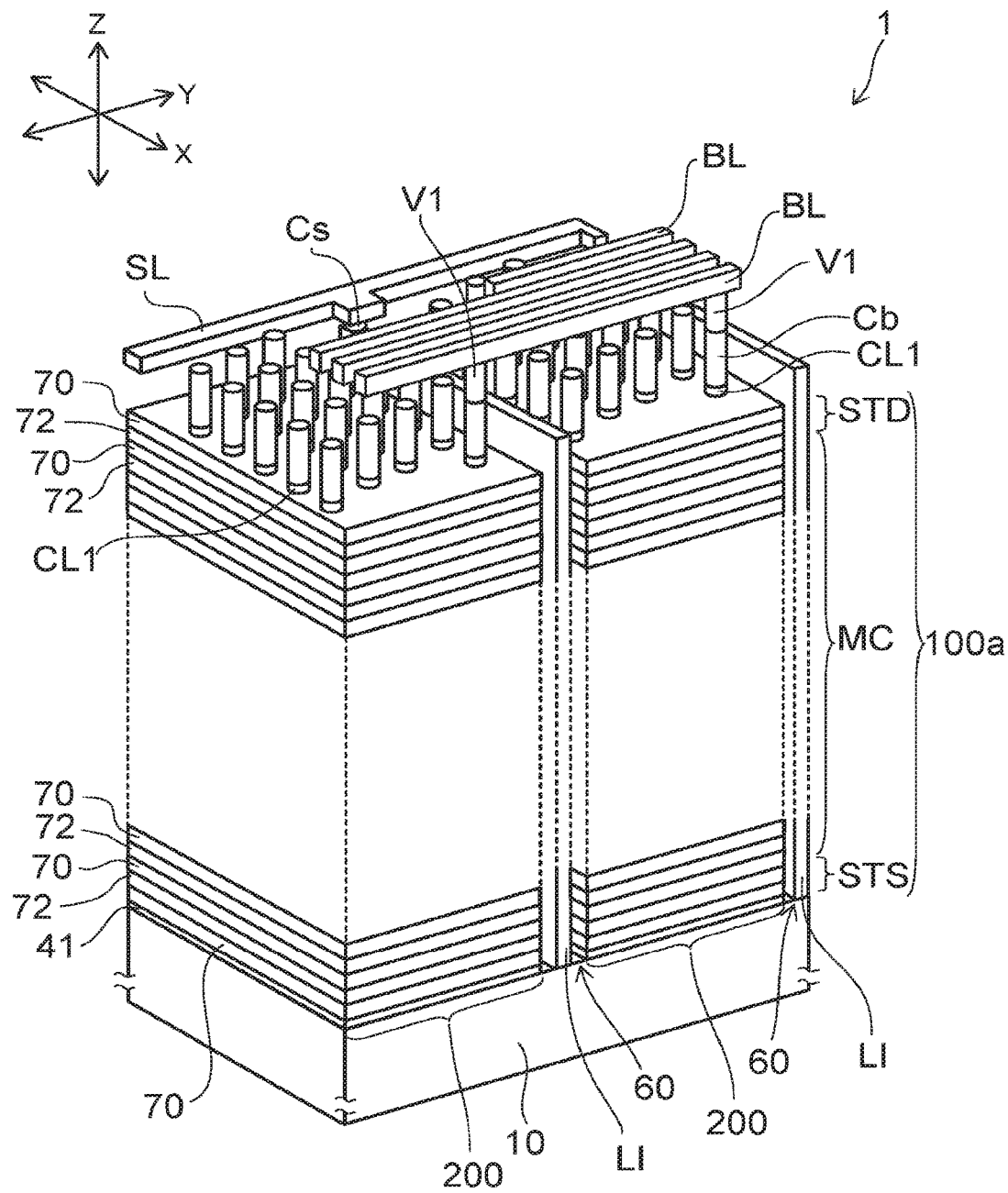
FIG. 3 is a schematic perspective view of the memory cell array of the embodiment.

FIG. 3 is a schematic perspective view of the memory cell array 1 of the embodiment.

In FIG. 3, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in the other drawings correspond respectively to the X-direction, the Y-direction, and the Z-direction of FIG. 3.

As shown in FIG. 3, the memory cell array 1 includes the substrate 10, a first stacked unit 100*a* stacked on the substrate 10, a plurality of first columnar portions CL1, a plurality of separation portions 60, and upper layer interconnects provided above the first stacked unit 100a. In FIG. 3, for example, bit lines BL and a source line SL are shown as the upper layer interconnects.

Figure 4:
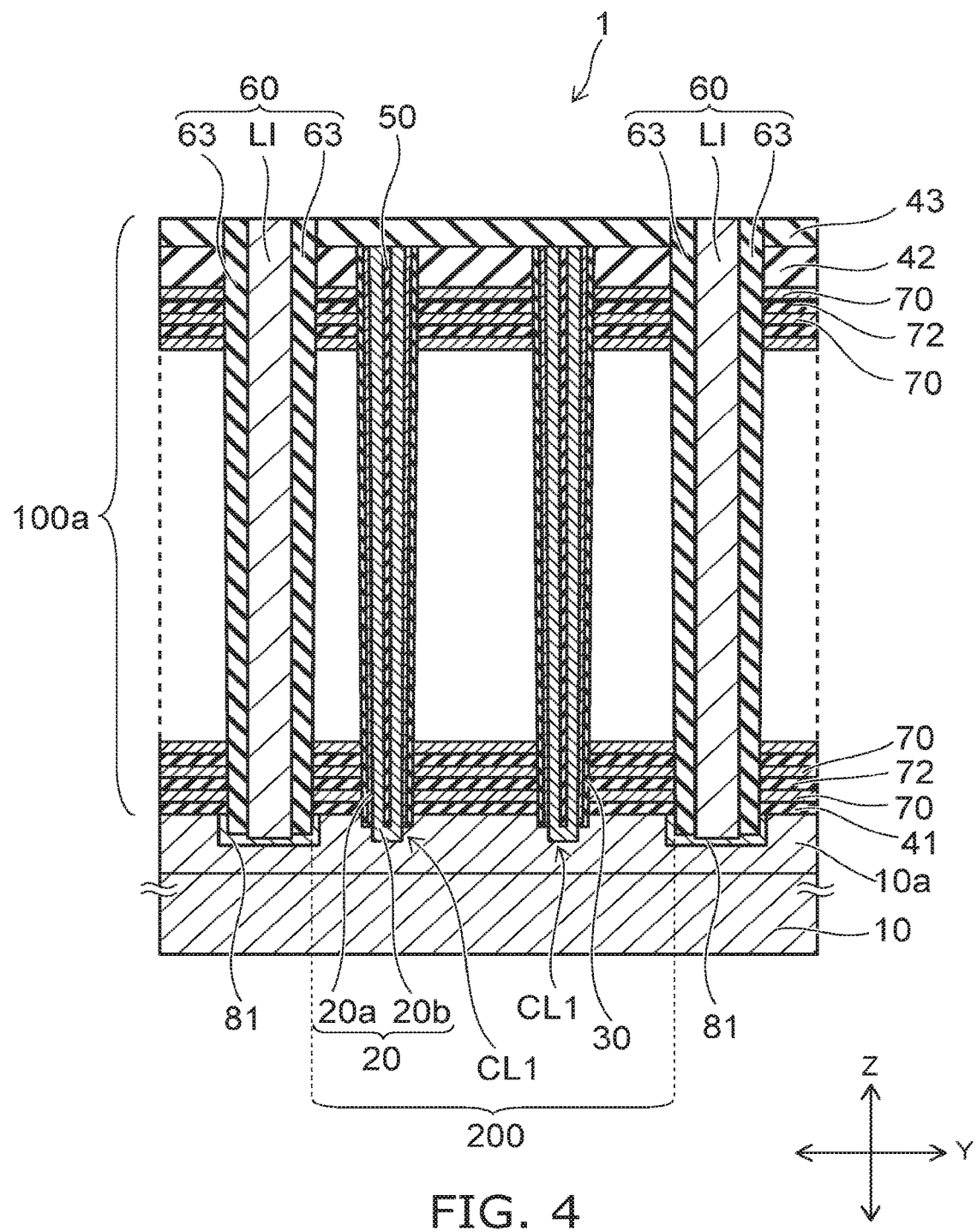
FIG. 4 is a schematic cross-sectional view of the memory cell array of the embodiment.

FIG. 4 is a schematic cross-sectional view of the memory cell array 1. FIG. 4 is an A-A' cross-sectional view of FIG. 2.

The first columnar portions CL1 are formed in circular column or elliptical columnar configurations extending in the stacking direction (the Z-direction) through the first stacked unit 100a. The separation portions 60 spread in the X-direction and the stacking direction of the first stacked unit 100a (the Z-direction), and divide the first stacked unit 100a into a plurality of blocks (or finger portions) 200 in the Y-direction.

As shown in FIG. 2, for example, the first columnar portions CL1 have a staggered arrangement. Or, the first columnar portions CL1 may have a square lattice arrangement along the X-direction and the Y-direction.

As shown in FIG. 3, the bit lines BL are provided above the first stacked unit 100a. The bit lines BL are, for example, metal films extending in the Y-direction. The bit lines BL are separated from each other in the X-direction.

The upper end of a semiconductor body 20 of the first columnar portion CL1 that is described below is connected to the bit line BL via a contact Cb and a contact V1 shown in FIG. 3.

The plurality of first columnar portions CL1 are connected to one common bit line BL. The plurality of first columnar portions CL1 that are connected to the common bit line BL include one first columnar portion CL1 selected from each block (or finger portion) 200 separated in the Y-direction by the separation portions 60.

As shown in FIG. 4, the first stacked unit 100a includes a plurality of electrode layers 70 stacked on the substrate 10. The electrode layers 70 are stacked in a direction (the Z-direction) perpendicular to the major surface of the substrate 10 with an insulating layer 72 interposed. The electrode layers 70 are metal layers and are, for example, tungsten layers or molybdenum layers.

An insulating film 41 is provided between the major surface of the substrate 10 and the electrode layer 70 of the lowermost layer. An insulating film 42 is provided on the electrode layer 70 of the uppermost layer; and an insulating film 43 is provided on the insulating film 42. The insulating film 43 covers the upper end of the first columnar portion CL1.

Figure 6:
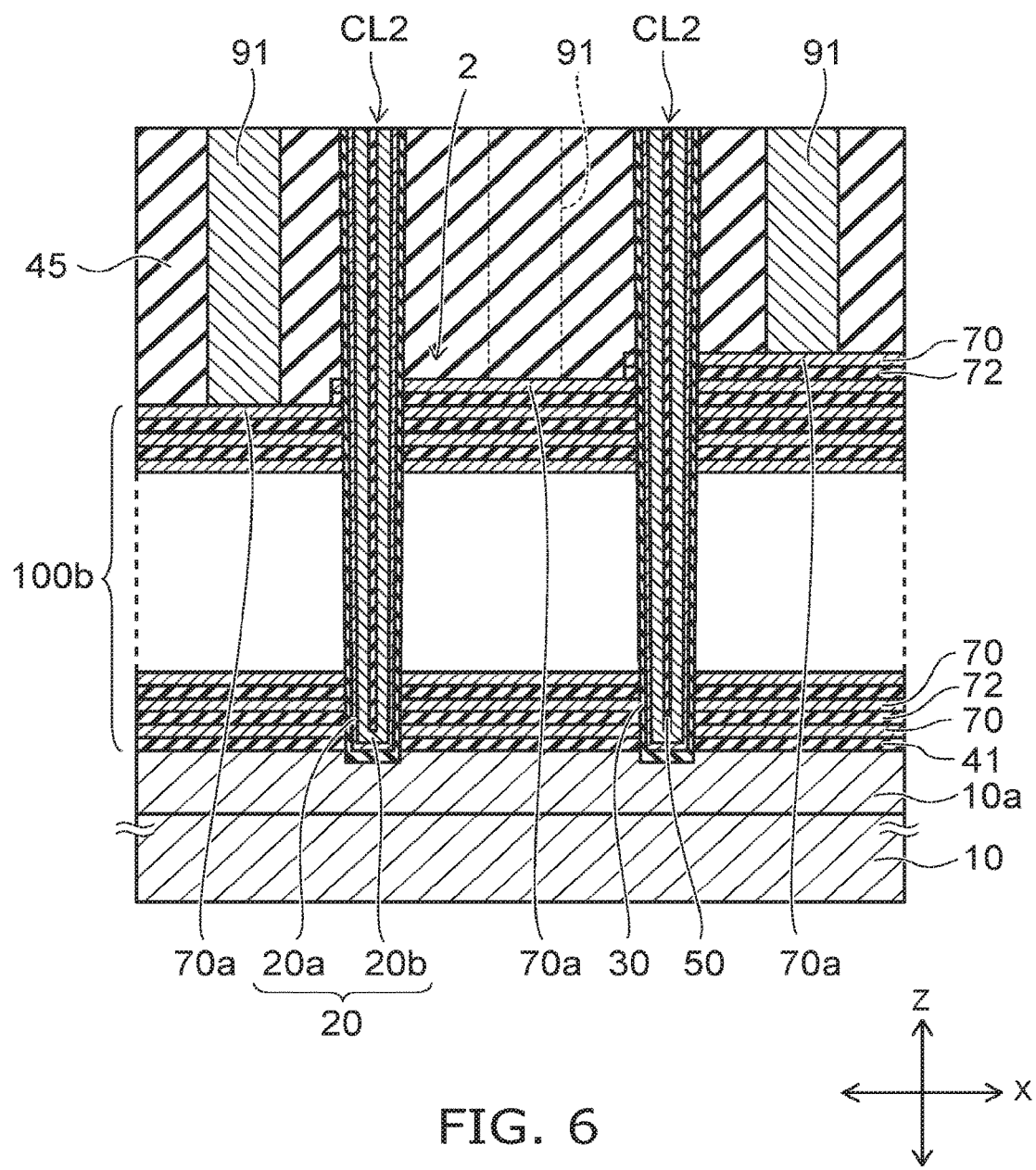
FIG. 6 is a schematic cross-sectional view of the stairstep portion of the embodiment.

The stacked body including the electrode layers 70 is provided also in the region where the stairstep portion 2 described below with reference to FIG. 6 is formed. The portion of the stacked body provided in the region where the memory cell array 1 is formed is taken as the first stacked unit 100a; and the portion of the stacked body provided in the region where the stairstep portion 2 is formed is taken as a second stacked unit 100b.

Figure 5:
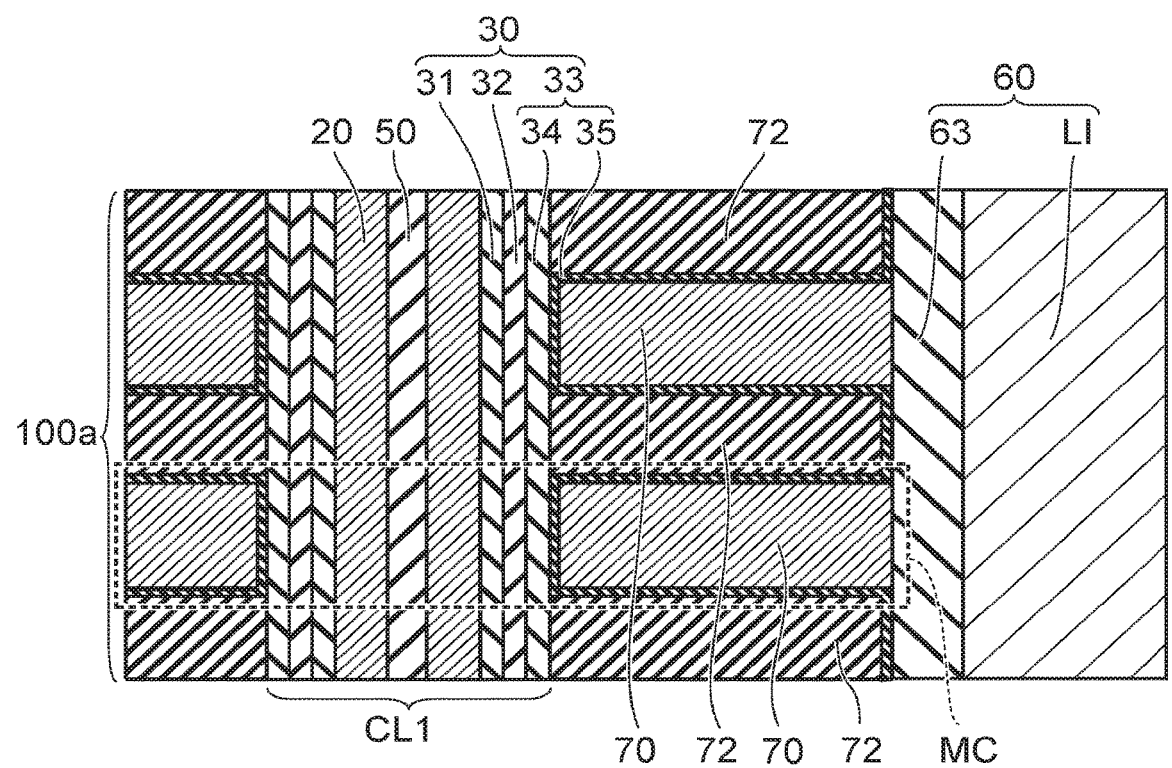
FIG. 5 is an enlarged cross-sectional view of one portion of FIG. 4.

FIG. 5 is an enlarged cross-sectional view of one portion of FIG. 4.

The first columnar portion CL1 includes a stacked film (a memory film) 30, the semiconductor body (the first semiconductor body) 20, and an insulative core film 50. The semiconductor body 20, the stacked film 30, and the core film 50 extend to be continuous along the stacking direction of the first stacked unit 100a.

The semiconductor body 20 extends in a pipe-like configuration in the stacking direction (the Z-direction) through the first stacked unit 100a. The stacked film 30 is provided between the electrode layer 70 and the semiconductor body 20, and surrounds the semiconductor body 20 from the outer circumferential side. The core film 50 is provided on the inner side of the semiconductor body 20 having the pipe-like configuration. The upper end of the semiconductor body 20 is connected to the bit line BL via the contact Cb and the contact V1 shown in FIG. 3.

As shown in FIG. 5, the stacked film 30 includes a tunneling insulating film 31, a charge storage film (a charge storage portion) 32, and a blocking insulating film 33. The blocking insulating film 33, the charge storage film 32, and the tunneling insulating film 31 are provided in order from the electrode layer 70 side between the electrode layer 70 and the semiconductor body 20. The charge storage film 32 is provided between the tunneling insulating film 31 and the blocking insulating film 33.

The semiconductor body 20, the stacked film 30, and the electrode layer 70 are included in a memory cell MC. One memory cell MC is schematically illustrated by a broken line in FIG. 5. The memory cell MC has a vertical transistor structure in which the electrode layer 70 surrounds, with the stacked film 30 interposed, the periphery of the semiconductor body 20.

In the memory cell MC having the vertical transistor structure, for example, the semiconductor body 20 is a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulator.

The tunneling insulating film 31 works as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of electrons from the electrode layer 70 into the first columnar portion CL1.

The blocking insulating film 33 includes a first blocking film 34 and a second blocking film 35. The first blocking film 34 is, for example, a silicon oxide film. The second blocking film 35 is a metal oxide film having a higher dielectric constant than the silicon oxide film. The second blocking film 35 is, for example, an aluminum oxide film.

The first blocking film 34 is provided between the charge storage film 32 and the second blocking film 35. The second blocking film 35 is provided between the first blocking film 34 and the electrode layer 70.

The second blocking film 35 is provided also between the electrode layer 70 and the insulating layer 72. The second blocking film 35 is formed continuously along the upper surface, lower surface, and side surface on the stacked film 30 side of the electrode layer 70. At the first columnar portion CL1, the second blocking film 35 is not continuous in the stacking direction of the first stacked unit 100a and is divided. However, similarly to the first blocking film 34, the second blocking film 35 may be formed to be continuous in the stacking direction of the first stacked unit 100a.

As shown in FIG. 3, a drain-side select transistor STD is provided at the upper layer portion of the first stacked unit 100a (the upper end portion of the first columnar portion CL1). A source-side select transistor STS is provided at the lower layer portion of the first stacked unit 100a (the lower end portion of the first columnar portion CL1). At least the electrode layer 70 of the uppermost layer functions as a control gate of the drain-side select transistor STD. At least the electrode layer 70 of the lowermost layer functions as a control gate of the source-side select transistor STS.

The memory cells MC are provided between the drain-side select transistor STD and the source-side select transistor STS. The memory cells MC, the drain-side select transistor STD, and the source-side select transistor STS are connected in series via the semiconductor body 20 of the first columnar portion CL1 and are included in one memory string. For example, the memory strings have a staggered arrangement in a planar direction parallel to the XY plane; and the memory cells MC are provided three-dimensionally in the X-direction, the Y-direction, and the Z-direction.

The separation portion 60 will now be described.

As shown in FIG. 4, the separation portion 60 includes an interconnect portion LI and an insulating film 63. The insulating film 63 is not shown in FIG. 3.

The interconnect portion LI spreads in the X-direction and the Z-direction and is, for example, a film containing a metal. The insulating film 63 is provided at the side surface of the interconnect portion LI. The insulating film 63 is provided between the first stacked unit 100a and the interconnect portion LI.

The substrate 10 is, for example, a silicon substrate. As shown in FIG. 4, an active region (a foundation layer) 10a which is a silicon region containing an impurity is formed in the surface of the substrate 10. The active region 10a is, for example, a p-type well. The lower end of the semiconductor body 20 of the first columnar portion CL1 contacts the active region 10a.

Figure 7A:
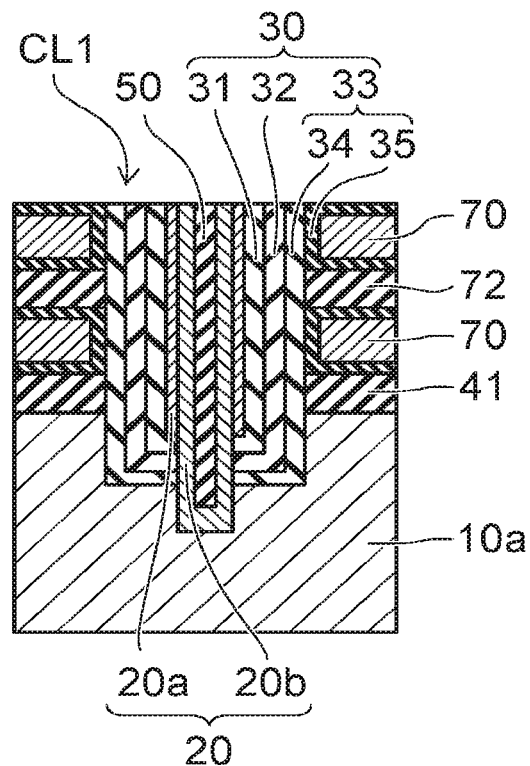
FIGS. 7A and 7B are schematic cross-sectional views of a lower end portion of a first columnar portion of the embodiment.

FIG. 7A is an enlarged cross-sectional view of the lower end portion of the first columnar portion CL1.

As shown in FIG. 7A, the semiconductor body 20 includes cover silicon 20a that contacts the side surface of the tunneling insulating film 31, and a silicon body 20b that is provided between the cover silicon 20a and the core film 50. The lower end portion of the silicon body 20b contacts the active region 10a.

Figure 7B:
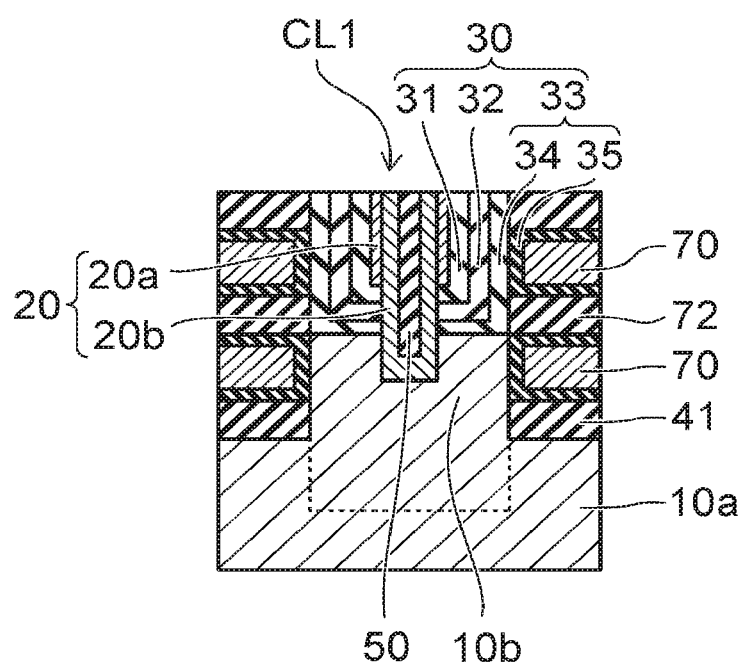

Or, as shown in FIG. 7B, the substrate 10 includes a protrusion 10b provided to protrude from the upper surface of the active region 10a. Similarly to the active region 10a, the protrusion 10b also is, for example, a p-type region.

After making a memory hole MH shown in FIG. 11 described below in the first stacked unit 100a, the protrusion 10b is formed by epitaxial growth of the silicon from the active region 10a exposed at the bottom of the memory hole MH. The outline of the bottom of the memory hole MH is illustrated by a broken line in FIG. 7B. The active region 10a and the protrusion 10b are one body of a monocrystalline body.

The first blocking film 34, the charge storage film 32, the tunneling insulating film 31, and the cover silicon 20a of the first columnar portion CL1 are formed in order inside the memory hole MH on the protrusion 10b. After removing the bottom of these stacked films, the silicon body 20b is formed inside the memory hole MH on the inner side of the cover silicon 20a; and the lower end portion of the silicon body 20b contacts the protrusion 10b.

A plurality of semiconductor regions 81 are formed in the surface of the active region 10a. The lower ends of the interconnect portions LI contact the semiconductor region 81. The plurality of semiconductor regions 81 are provided to correspond to the plurality of interconnect portions LI. The semiconductor regions 81 include an n-type semiconductor region 81 and a p-type semiconductor region 81.

The interconnect portions LI include the interconnect portion LI that is connected to the n-type semiconductor region 81, and the interconnect portion LI that is connected to the p-type semiconductor region 81.

The upper end of the interconnect portion LI connected to the n-type semiconductor region 81 is connected to the source line SL via a contact Cs shown in FIG. 3.

By controlling the potential applied to the electrode layer 70 of the lowermost layer, an n-channel (an inversion layer) can be induced in the surface of the p-type active region 10a between the n-type semiconductor region 81 and the lower end of the semiconductor body 20; and a current can be caused to flow between the n-type semiconductor region 81 and the lower end of the semiconductor body 20. The electrode layer 70 of the lowermost layer functions as a control gate for inducing the channel in the surface of the active region 10a; and the insulating film 41 functions as a gate insulating film.

In a read-out operation, electrons are supplied from the interconnect portion LI to the semiconductor body 20 via the n-type semiconductor region 81 and the n-channel.

The upper end of the interconnect portion LI connected to the p-type semiconductor region 81 is connected to a not-shown upper layer interconnect. In an erasing operation, the p-type semiconductor region 81 supplies holes to the semiconductor body 20 via the active region 10a.

The structure of the peripheral region where the stairstep portion 2 is formed will now be described.

FIG. 6 is a B-B' cross-sectional view of FIG. 2.

The stacked body including the electrode layers 70 stacked with the insulating layer 72 interposed is provided also at the periphery of the memory cell array region where the memory cell array 1 is formed. The stacked body including the electrode layers 70 extends in the X-direction from the memory cell array region to the periphery region. The stacked body of the periphery region is taken as the second stacked unit 100b.

The electrode layers 70 of the second stacked unit 100b have a plurality of terrace portions 70a arranged in a stairstep configuration by forming differences in levels along the X-direction. The stairstep portion 2 is formed of the plurality of terrace portions 70a. The upper surface of the terrace portion 70a of each electrode layer 70 is not covered with the upper electrode layer 70.

The active region 10a is formed also in the surface of the substrate 10 in the peripheral region where the stairstep portion 2 is formed.

As shown in FIG. 2, the separation portions 60 also extend in the X-direction from the memory cell array region to the peripheral region where the stairstep portion 2 is formed. The second stacked unit 100b also is divided into the plurality of blocks (or finger portions) 200 in the Y-direction by the separation portions 60. The terrace portions 70a also are divided in the Y-direction by the separation portions 60.

Similarly to the interconnect portion LI of the memory cell array region, the lower end portion of the interconnect portion LI of the separation portion 60 contacts the active region 10a in the peripheral region where the stairstep portion 2 is formed as well.

As shown in FIG. 6, an insulating layer 45 is provided on the stairstep portion 2. The insulating layer 45 buries the differences in levels of the stairstep portion 2. Also, the insulating layer 45 eliminates or relaxes the difference in levels between the second stacked unit 100b and the first stacked unit 100a. The insulating layer 45 also is divided in the Y-direction by the separation portions 60.

A plurality of contact vias 91 that extend in the Z-direction are provided inside the insulating layer 45. The contact vias 91 pierce the insulating layer 45; and the lower ends of the contact vias 91 respectively contact the corresponding terrace portions 70a of the electrode layers 70.

The contact vias 91 are conductors containing a metal; and each of the contact vias 91 is connected to a not-shown upper layer interconnect. For example, the upper layer interconnect is electrically connected to the control circuit formed in the surface of the substrate 10. The potential of the electrode layer 70 of each layer of the memory cell array 1 is controlled through the contact via 91 and the terrace portion 70a.

A plurality of second columnar portions CL2 are disposed in the peripheral region where the stairstep portion 2 is formed. The second columnar portions CL2 are formed in circular column or elliptical columnar configurations extending in the Z-direction inside the insulating layer 45 and through the second stacked unit 100b. The lower end portions of the second columnar portions CL2 reach the active region 10a.

In the example shown in FIG. 2, one contact via 91 and two second columnar portions CL2 are disposed every one terrace portion 70a.

In the process shown in FIG. 27 described below, the second columnar portions CL2 function as pillars supporting the second stacked unit 100b including gaps 44. The second columnar portions CL2 function as simple pillars used for the process. On the other hand, the first columnar portions CL1 described above are functional components that are structurally furnished in the memory cell array 1.

As shown in FIG. 2, the first columnar portions CL1 in the memory cell array region are arranged more densely than the second columnar portions CL2 in the peripheral region.

The second columnar portions CL2 are formed simultaneously when forming the first columnar portions CL1 of the memory cell array 1; and the second columnar portions CL2 include the stacked film 30, the semiconductor body 20, and the core film 50 similarly to the first columnar portions CL1.

Figure 8A:
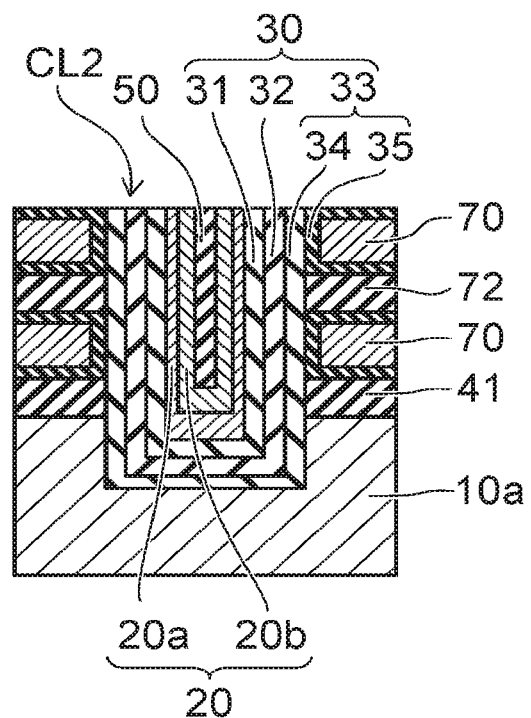
FIGS. 8A to 9B are schematic cross-sectional views of a lower end portion of a second columnar portion of the embodiment.

FIG. 8A is an enlarged cross-sectional view of the lower end portion of the second columnar portion CL2.

The stacked film that includes the tunneling insulating film 31, the charge storage film 32, and the first blocking film 34 is provided as an insulating film between the active region 10a and the semiconductor body (the second semiconductor body) 20 of the second columnar portion CL2. The semiconductor body 20 of the second columnar portion CL2 does not contact the active region 10a.

Figure 8B:
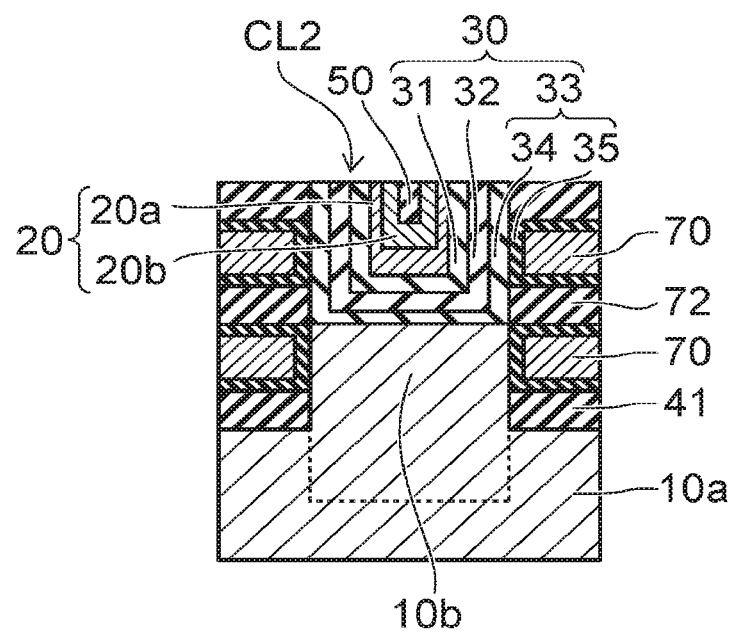

Or, as shown in FIG. 8B, in the peripheral region where the stairstep portion 2 is formed, the substrate 10 includes the protrusion 10b provided to protrude from the upper surface of the active region 10a. Similarly to the active region 10a, the protrusion 10b is, for example, a p-type region.

After making a hole HR shown in FIG. 23 described below in the second stacked unit 100b, the protrusion 10b is formed by epitaxial growth of the silicon from the active region 10a exposed at the bottom of the hole HR. The outline of the bottom of the hole HR is illustrated by a broken line in FIG. 8B. The active region 10a and the protrusion 10b are one body of a monocrystalline body.

The first blocking film 34, the charge storage film 32, the tunneling insulating film 31, and the cover silicon 20a of the second columnar portion CL2 are formed in order inside the hole HR on the protrusion 10b. Subsequently, the silicon body 20b is formed inside the hole HR on the inner side of the cover silicon 20a without removing the bottom of these stacked films. The stacked film that includes the tunneling insulating film 31, the charge storage film 32, and the first blocking film 34 is provided as an insulating film between the silicon body 20b and the active region 10a. The semiconductor body 20 of the second columnar portion CL2 does not contact the active region 10a.

In the case where the positions in the XY plane of the contact via 91 and the second columnar portion CL2 shown in FIG. 2 overlap, the contact via 91 and the semiconductor body 20 of the second columnar portion CL2 may contact each other. In such a case, if the semiconductor body 20 of the second columnar portion CL2 contacts the active region 10a of the substrate 10 in the cross section shown in FIG. 6, the contact vias 91 that are connected to terrace portions 70a of different levels may be shorted via the semiconductor bodies 20 and the active region 10a. This may cause shorts between electrode layers 70 of different layers.

However, according to the embodiment, because the semiconductor body 20 of the second columnar portion CL2 does not contact the substrate 10, the contact via 91 is not electrically connected (shorted) to the substrate 10 via the semiconductor body 20 of the second columnar portion CL2. Further, the contact via 91 is not connected (shorted) to the interconnect portion LI via the semiconductor body 20 and the substrate 10.

The tolerance of the contact between the contact via 91 and the semiconductor body 20 makes it possible to reduce the distance between the contact via 91 and the semiconductor body 20; and the surface area of one terrace portion 70a where the contact via 91 and the semiconductor body 20 are disposed can be set to be small. This may cause the reduction of the chip size.

A method for manufacturing the semiconductor device of the embodiment will now be described.

First, the processes for the first stacked unit 100a in the region where the memory cell array 1 is formed will be described with reference to FIG. 10 to FIG. 20.

Figure 10:
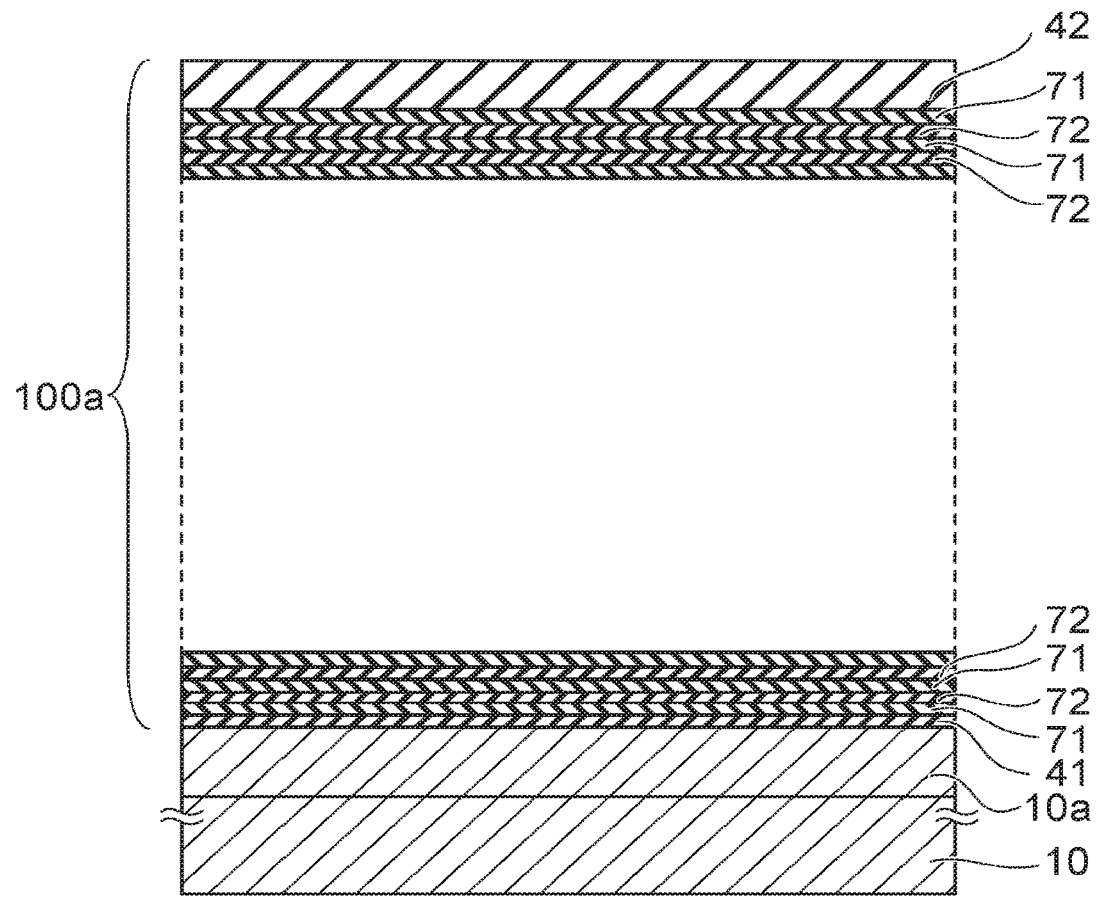
FIGS. 10 to 30 are schematic cross-sectional views showing a method for manufacturing the semiconductor device of the embodiment.

As shown in FIG. 10, the first stacked unit 100a is formed on the substrate 10 having the active region 10a at the surface. The insulating film 41 is formed on the active region 10a; and a sacrificial layer 71 as the first layer and the insulating layer 72 as the second layer are stacked alternately on the insulating film 41. The process of alternately stacking the sacrificial layer 71 and the insulating layer 72 is repeated; and the plurality of sacrificial layers 71 and the plurality of insulating layers 72 are formed on the substrate 10. The sacrificial layer 71 of the lowermost layer is formed on the insulating film 41; and the insulating film 42 is formed on the sacrificial layer 71 of the uppermost layer. For example, the sacrificial layers 71 are silicon nitride layers; and the insulating layers 72 are silicon oxide layers.

Figure 11:
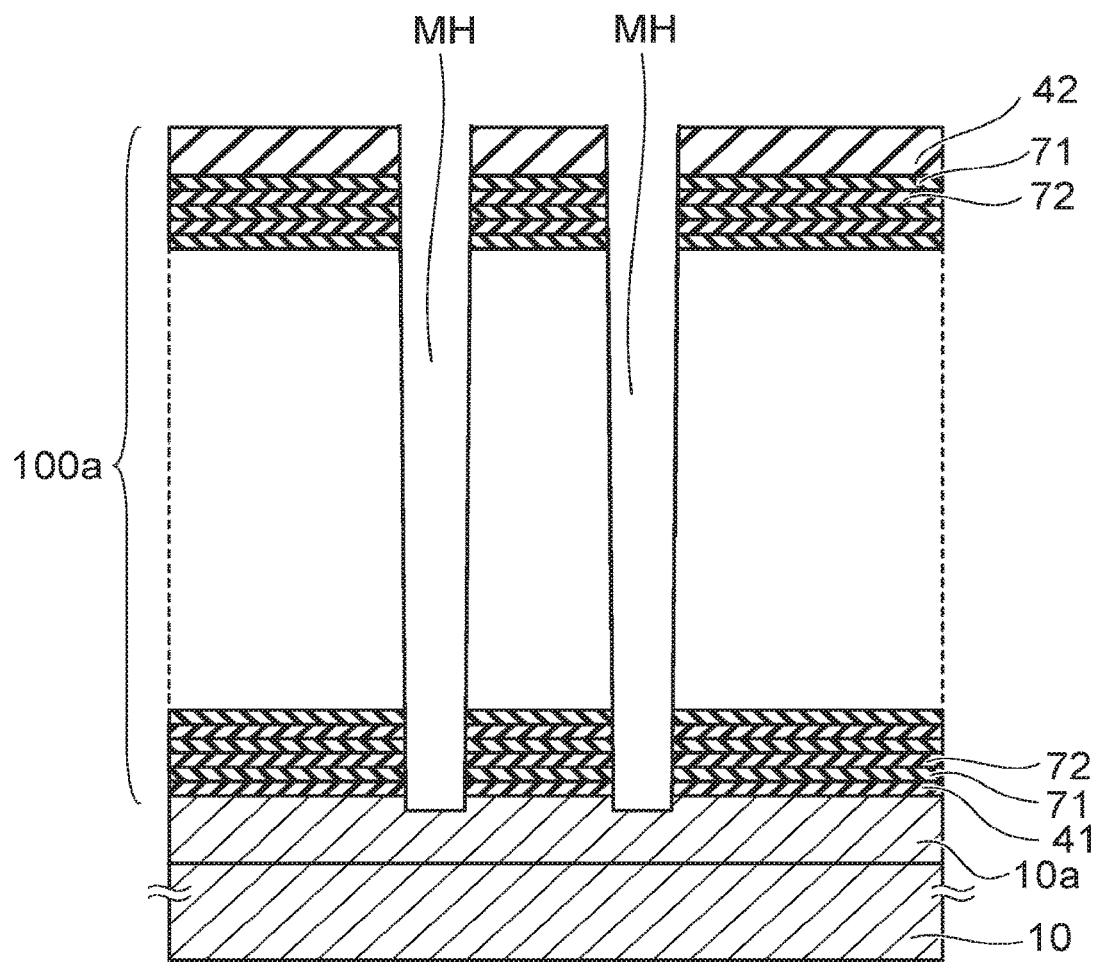

Then, as shown in FIG. 11, the plurality of memory holes MH are made in the first stacked unit 100a. The memory holes MH are made by reactive ion etching (RIE) using a not-shown mask. The memory holes MH extend in the stacking direction of the first stacked unit 100a (the Z-direction) and reach the substrate 10.

Figure 12:
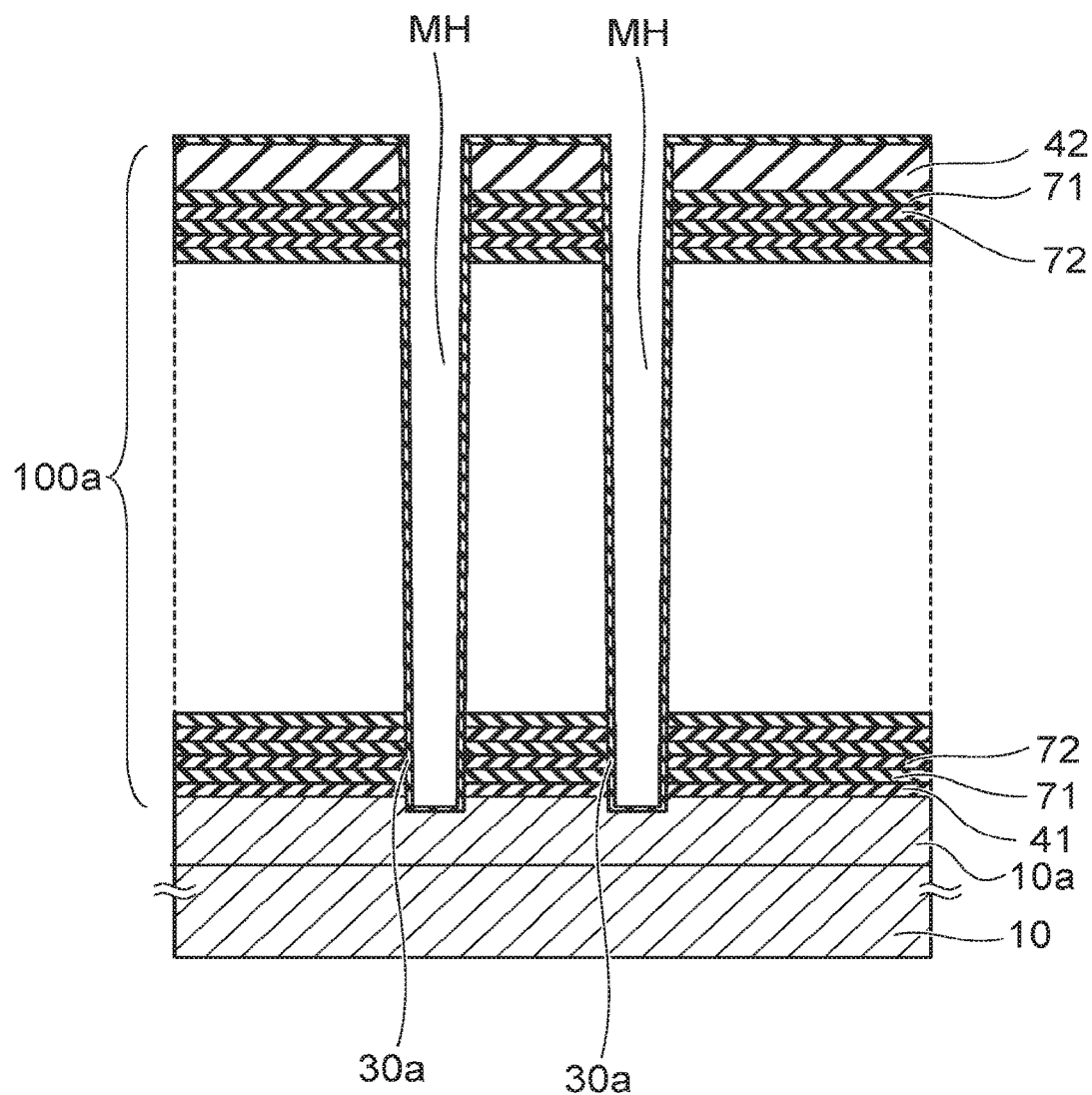

As shown in FIG. 12, a stacked film 30a is formed inside the memory holes MH. The stacked film 30a is formed conformally along the side surfaces and bottoms of the memory holes MH. The stacked film 30a includes the tunneling insulating film 31, the charge storage film 32, and the first blocking film 34 of the stacked film 30 shown in FIG. 5. The first blocking film 34, the charge storage film 32, and the tunneling insulating film 31 are formed in order inside the memory holes MH.

Figure 13:
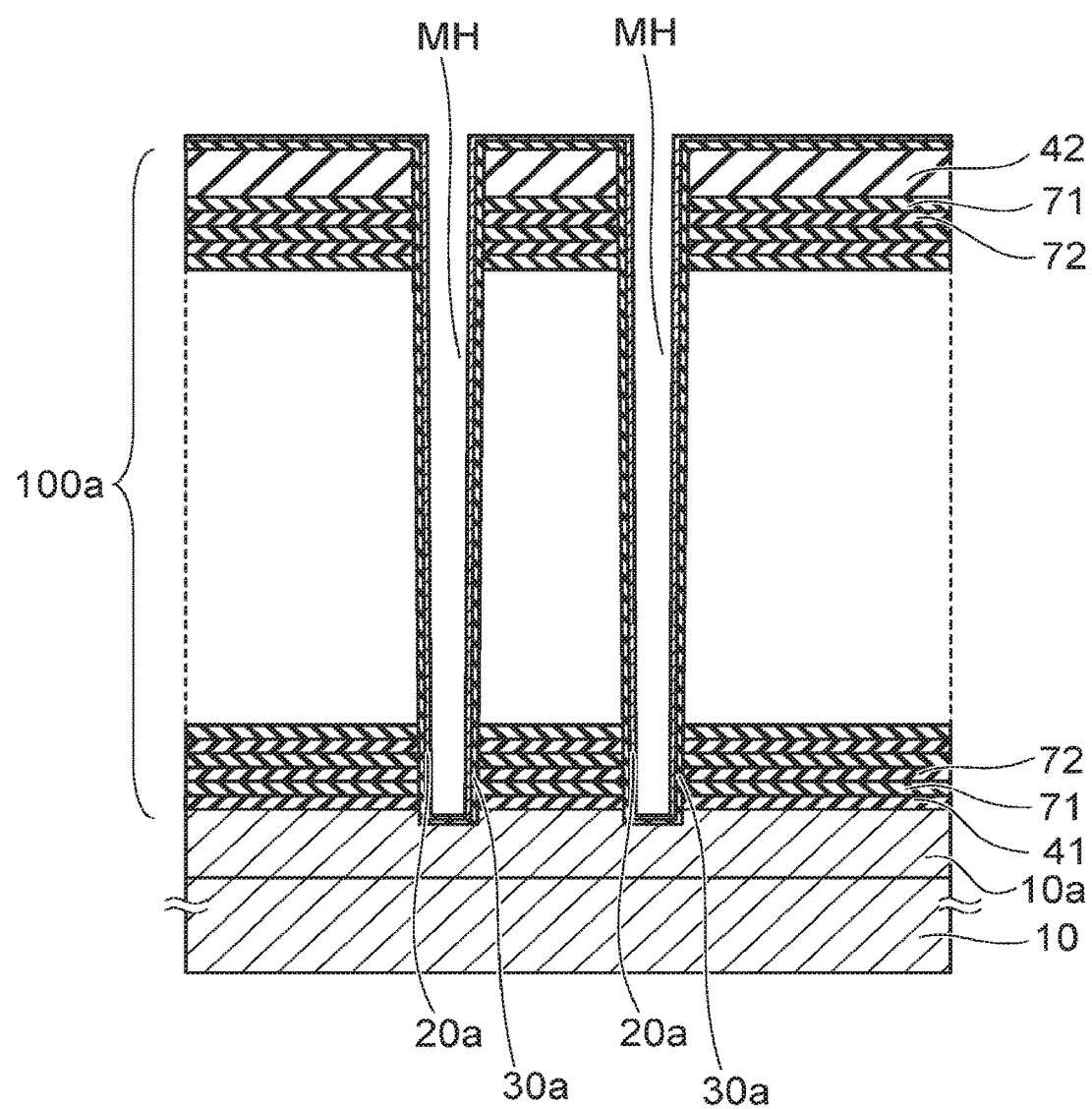

As shown in FIG. 13, the cover silicon 20a is formed on the inner side of the stacked film 30a. The cover silicon 20a is formed conformally along the side surfaces and bottoms of the memory holes MH.

Figure 14:
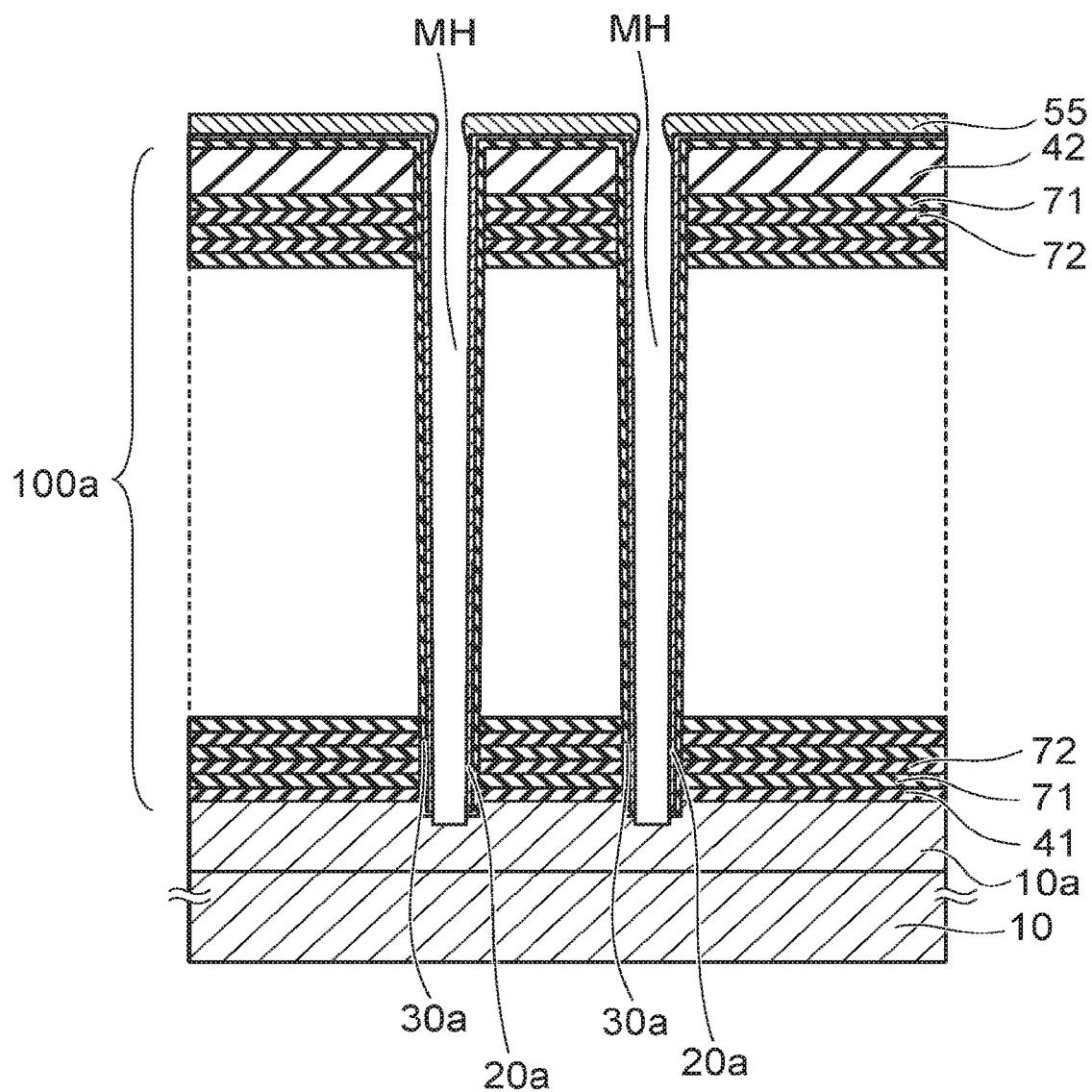

Then, as shown in FIG. 14, a mask layer 55 is formed on the first stacked unit 100a; and the cover silicon 20a and the stacked film 30a deposited on the bottoms of the memory holes MH are removed by RIE. In the RIE, the stacked film 30a formed on the side surfaces of the memory holes MH is protected by being covered with the cover silicon 20a and is not damaged by the RIE.

Also, the mask layer 55 covers the corners of the openings of the memory holes MH and protects the cover silicon 20a and the stacked film 30a formed on the corners from the etching.

Figure 15:
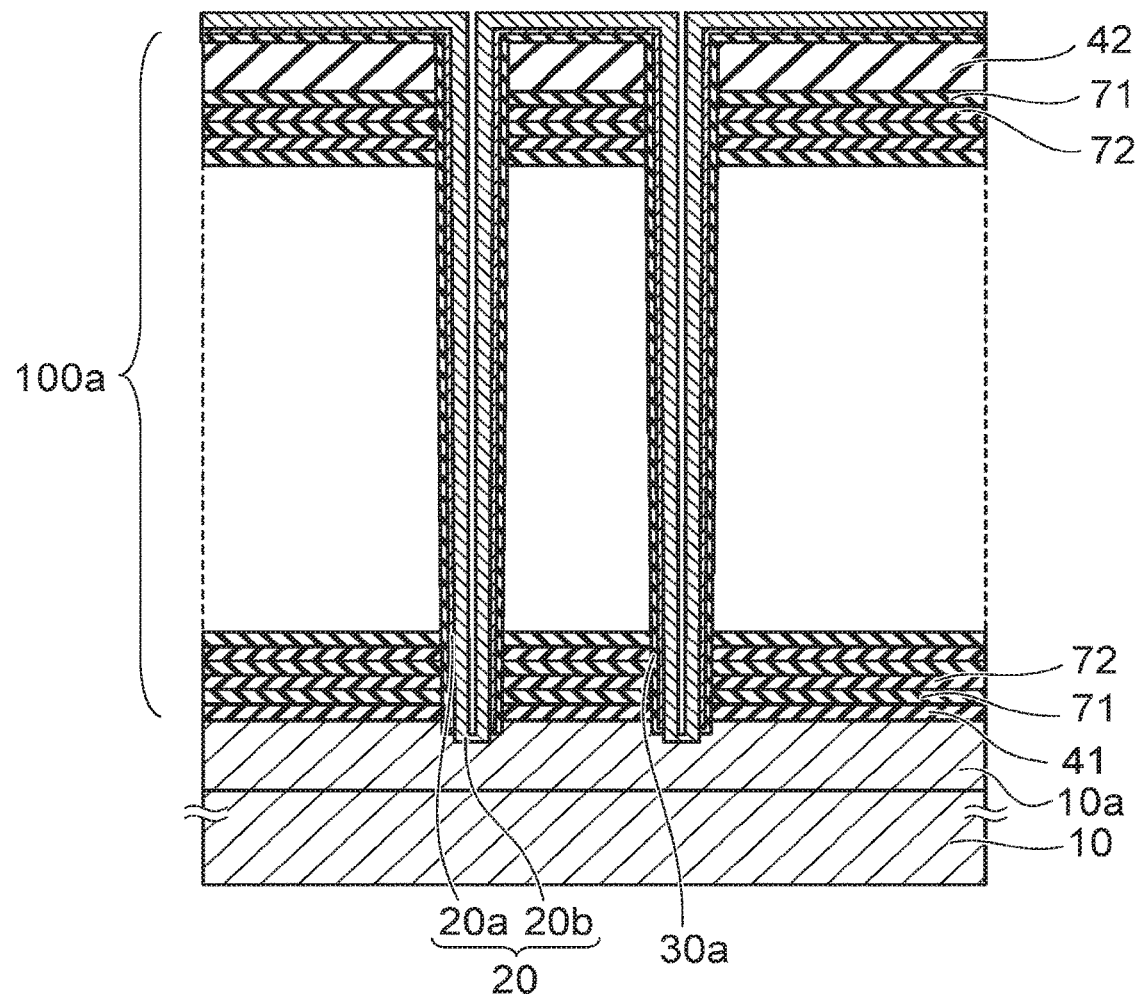

After removing the mask layer 55, as shown in FIG. 15, the silicon body 20b is formed inside the memory holes MH. The silicon body 20b is formed on the side surface of the cover silicon 20a and on the bottoms of the memory holes MH where the substrate 10 is exposed. The lower end portion of the silicon body 20b contacts the active region 10a of the substrate 10.

For example, after the cover silicon 20a and the silicon body 20b are formed as amorphous silicon films, the cover silicon 20a and the silicon body 20b are crystallized into polycrystalline silicon films by heat treatment.

Figure 16:
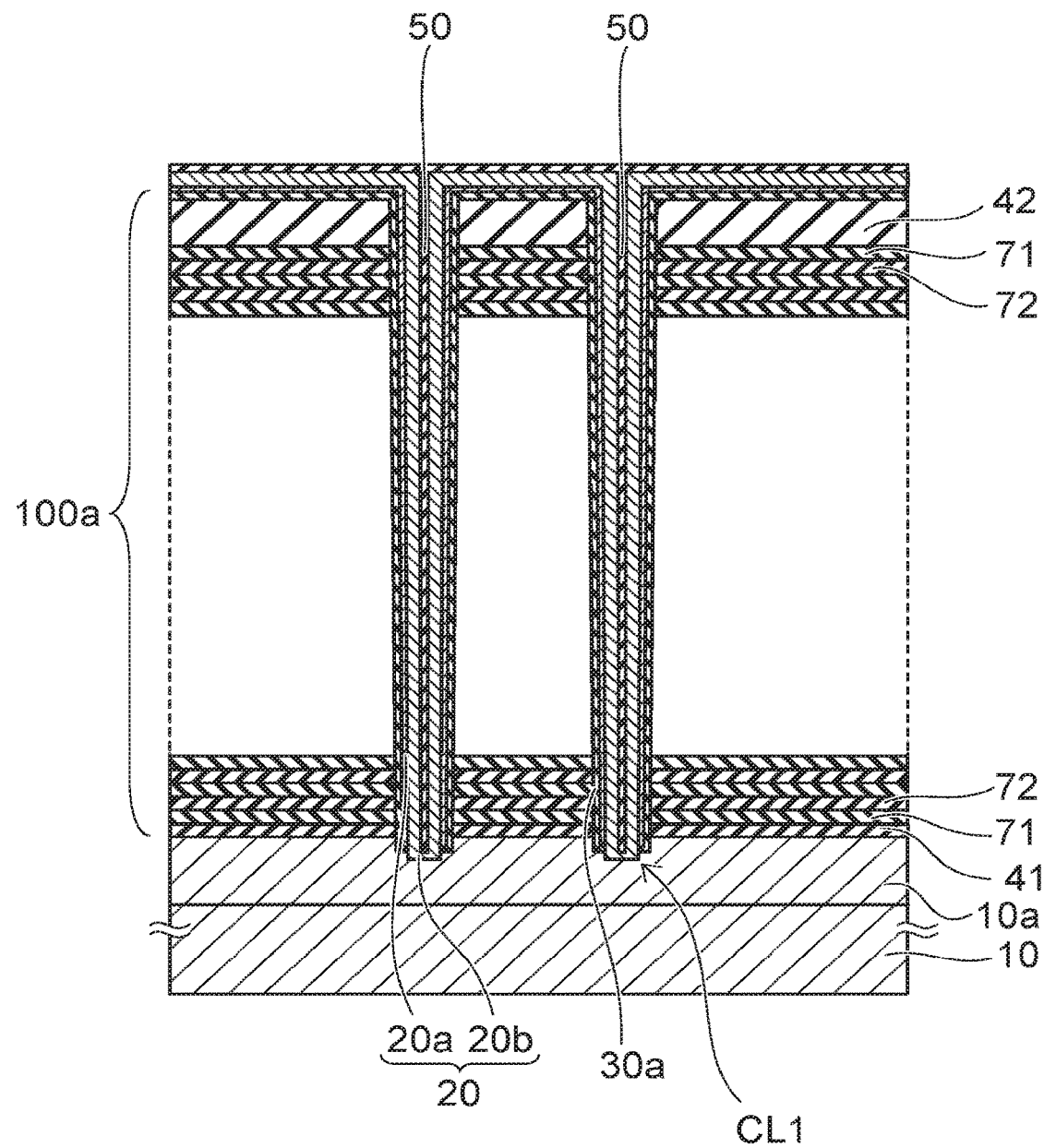

As shown in FIG. 16, the core film 50 is formed on the inner side of the silicon body 20b. The first columnar portions CL1 that include the stacked film 30a, the semiconductor body 20, and the core film 50 are formed inside the first stacked unit 100a.

Figure 17:
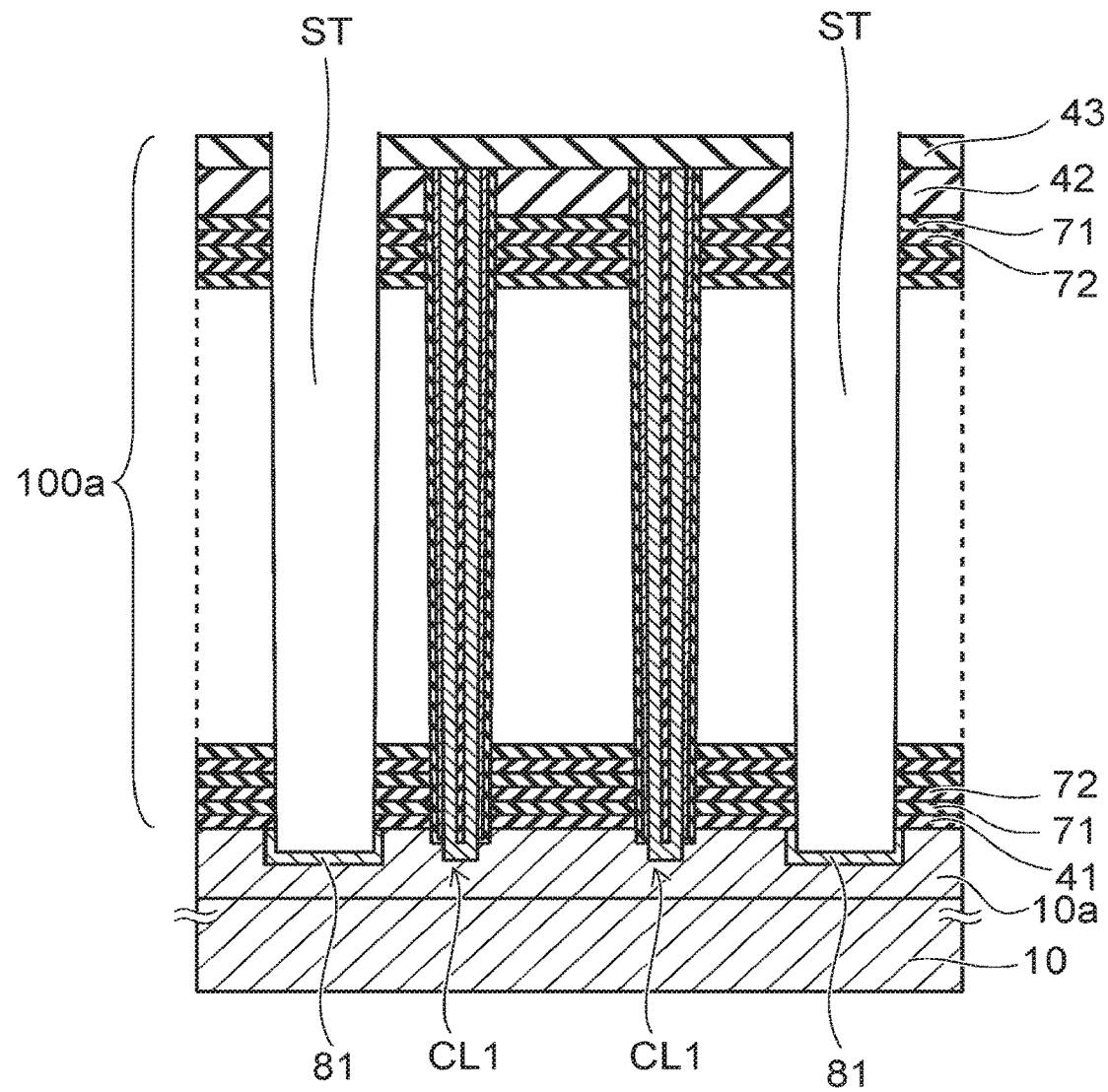

The films deposited on the insulating film 42 shown in FIG. 16 are removed by chemical mechanical polishing (CMP) or etch-back. Subsequently, as shown in FIG. 17, the insulating film 43 is formed on the insulating film 42. The insulating film 43 covers the upper ends of the first columnar portions CL1.

Then, a plurality of slits ST extending in the stacking direction are made in the first stacked unit 100a. The slits ST are made, by RIE using a not-shown mask, in the first stacked unit 100a including the insulating film 43, the insulating film 42, the sacrificial layers 71, the insulating layers 72, and the insulating film 41. The slits ST pierce the first stacked unit 100a and reach the active region 10a.

As shown in FIG. 2, the slits ST extend in the X-direction and are made also in the second stacked unit 100b and the insulating layer 45 on the second stacked unit 100b which are described below.

The n-type or p-type semiconductor region 81 is formed in the surface of the active region 10a at the bottoms of the slits ST by implanting an impurity into the active region 10a exposed at the bottoms of the slits ST by ion implantation.

Then, the sacrificial layers 71 are removed by an etchant or an etching gas supplied through the slits ST. For example, the sacrificial layers 71 which are silicon nitride layers are removed using an etchant containing phosphoric acid.

Figure 18:
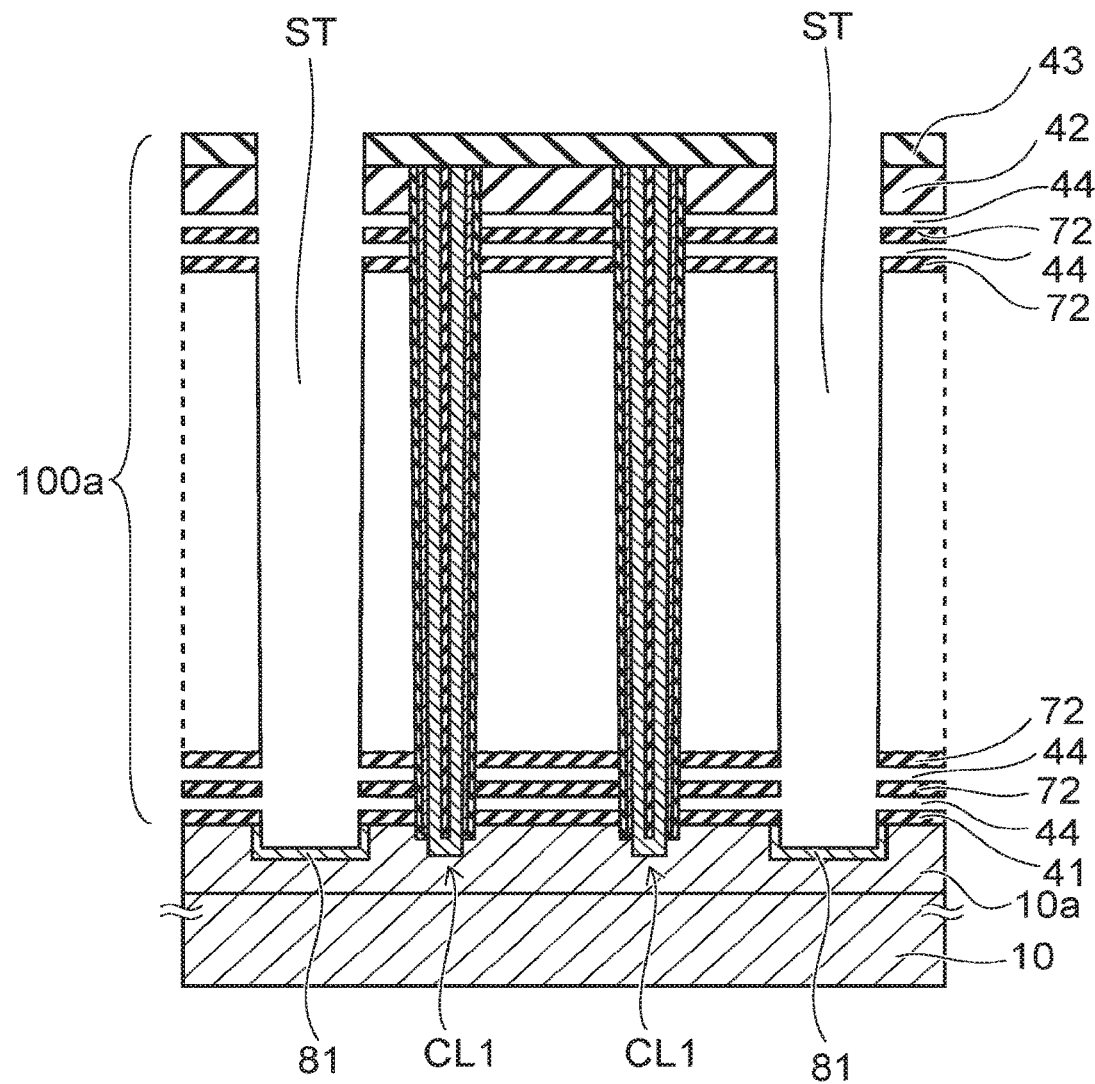

The sacrificial layers 71 are removed; and as shown in FIG. 18, the gaps 44 are made between the insulating layers 72 adjacent to each other above and below. The gaps 44 are made also between the insulating film 41 and the insulating layer 72 of the lowermost layer, and between the insulating film 42 and the insulating layer 72 of the uppermost layer.

The insulating layers 72 of the first stacked unit 100a contact the side surfaces of the first columnar portions CL1 to surround the side surfaces of the first columnar portions CL1. The insulating layers 72 are supported by such a physical bond with the multiple first columnar portions CL1; and the gaps 44 between the insulating layers 72 are maintained.

Figure 19:
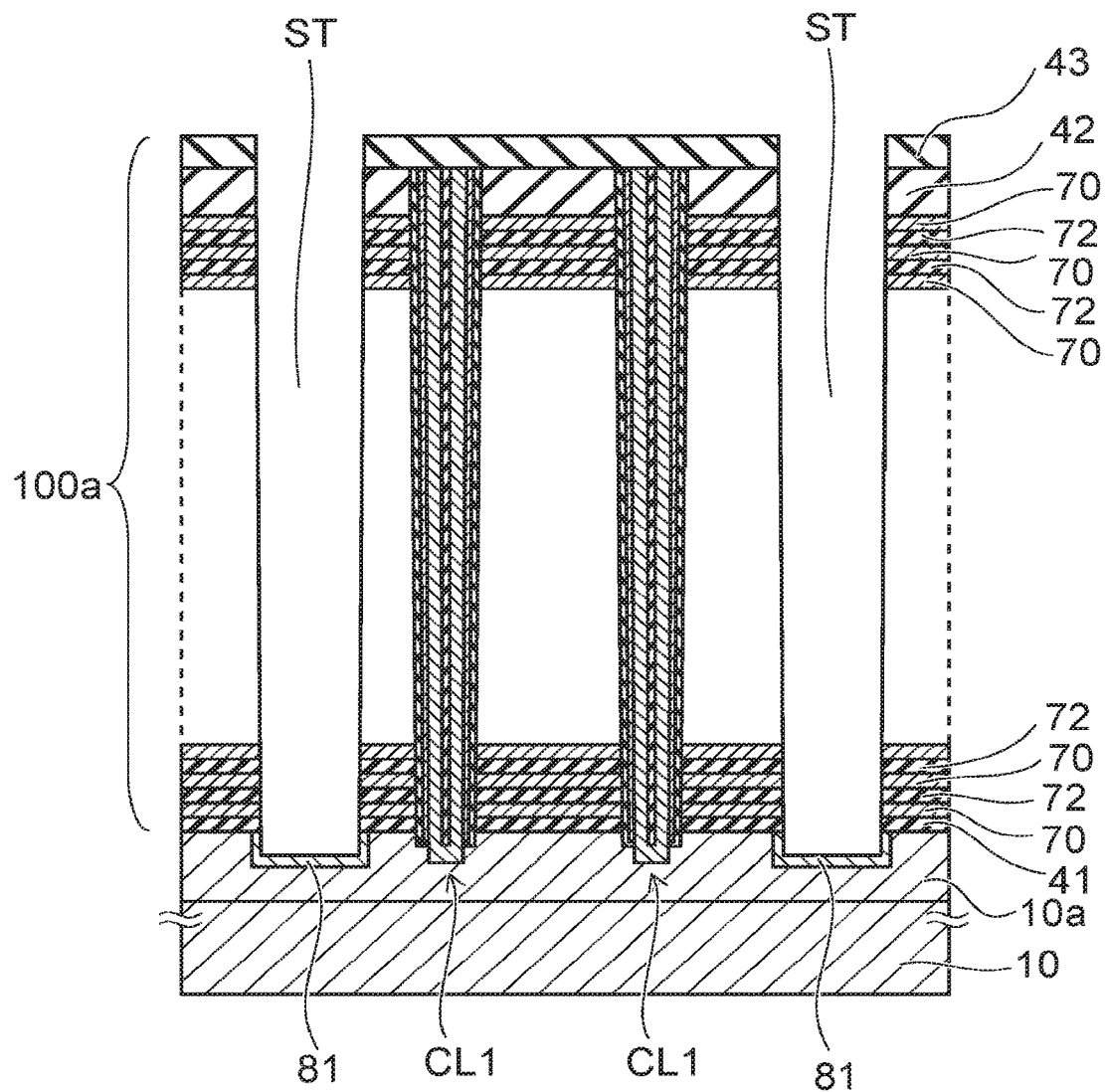

The electrode layers 70 shown in FIG. 19 are formed, with the second blocking film 35 shown in FIG. 5 interposed, in the gaps 44. For example, the second blocking film 35 and the electrode layers 70 are formed by chemical vapor deposition (CVD). The source gases are supplied to the gaps 44 through the slits ST.

Figure 20:
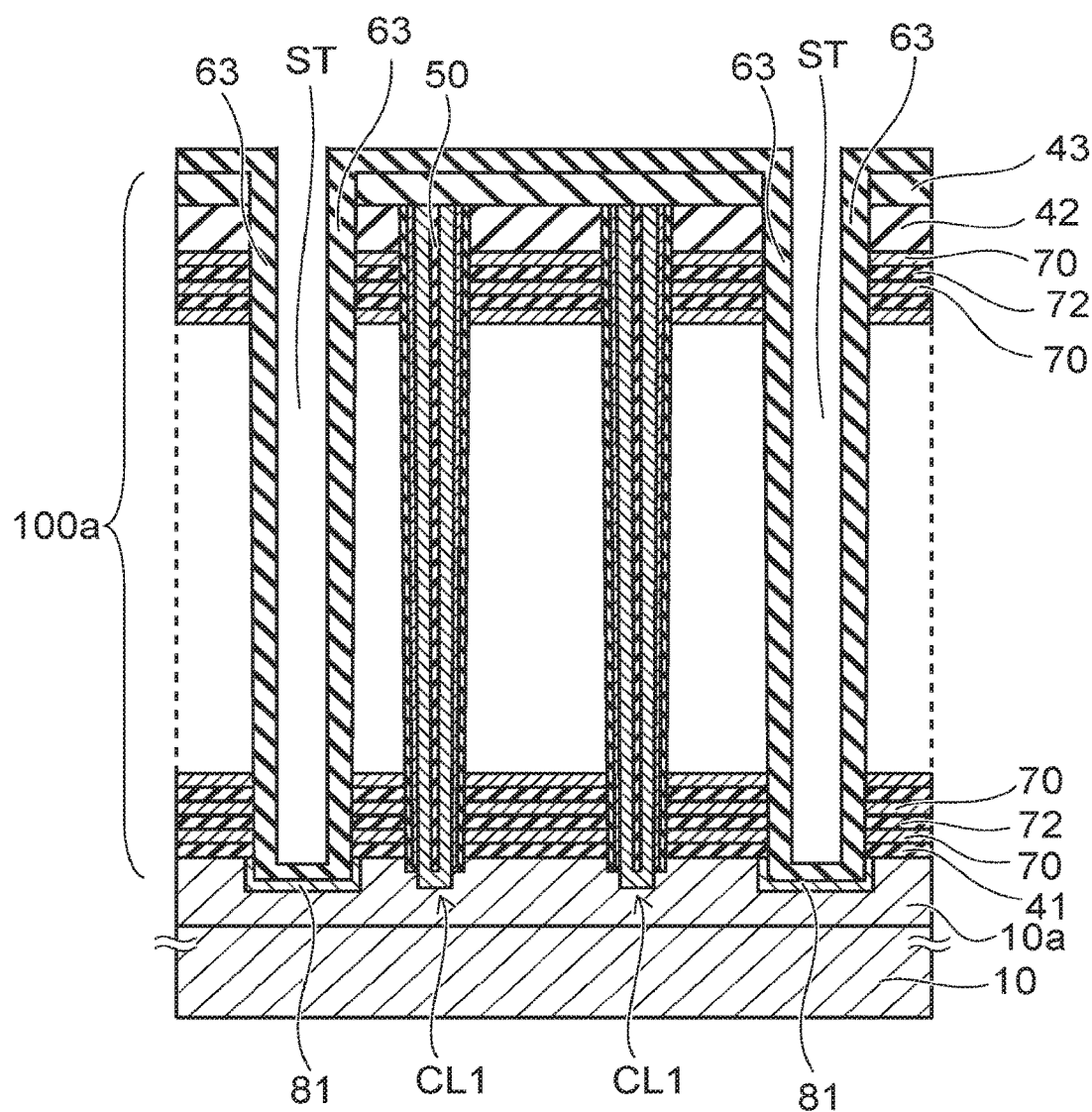

Subsequently, as shown in FIG. 20, the insulating film 63 is formed on the side surfaces and bottoms of the slits ST. After removing the insulating film 63 that is formed at the bottoms of the slits ST by RIE, the interconnect portion LI is buried in the inner side of the insulating film 63 inside the slits ST as shown in FIG. 4. The lower end portion of the interconnect portion LI contacts the active region 10a of the substrate 10 with the semiconductor region 81 interposed.

The processes for the second stacked unit 100b in the peripheral region where the stairstep portion 2 is formed will now be described with reference to FIG. 21 to FIG. 30.

In the peripheral region where the stairstep portion 2 is formed as well, the insulating film 41 is formed on the active region 10a of the substrate 10; and the sacrificial layers 71 and the insulating layers 72 are formed on the insulating film 41. The stacked body on the substrate 10 is taken as the second stacked unit 100b.

Figure 21:
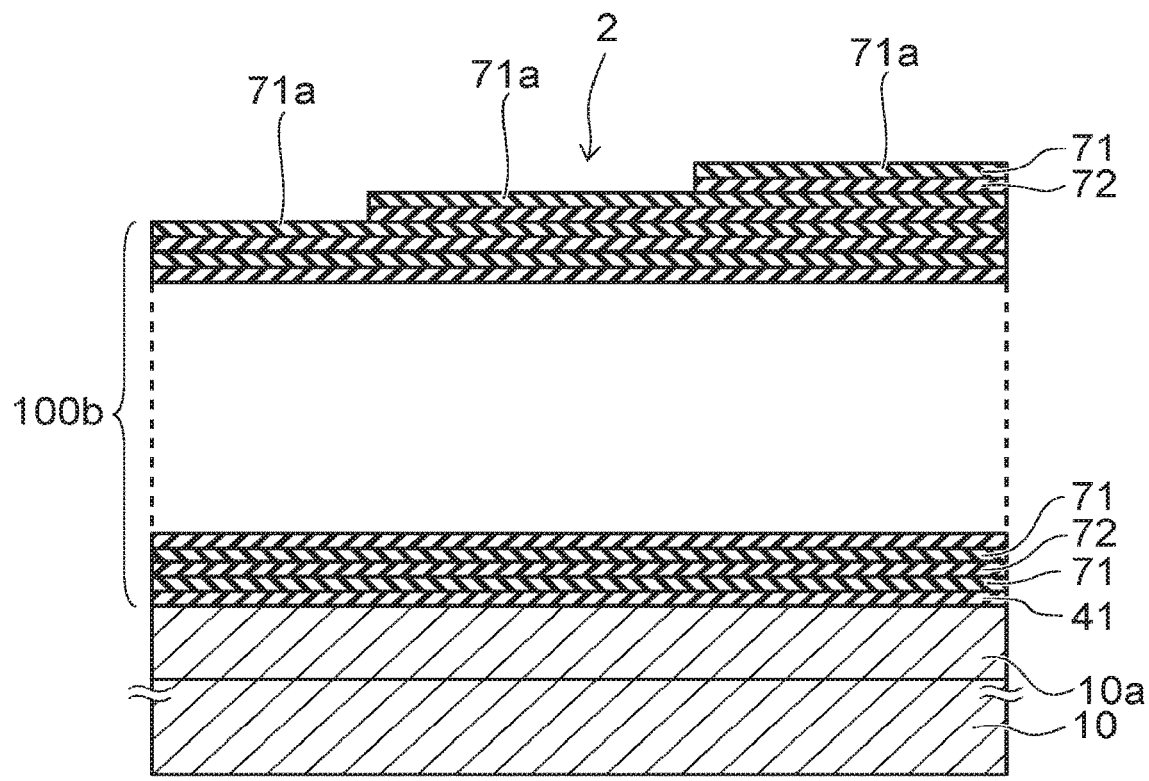

As shown in FIG. 21, the stairstep portion 2 is formed in a portion of the second stacked unit 100b. For example, the sacrificial layers 71 and the insulating layers 72 are patterned into a stairstep configuration along the X-direction by repeating RIE using a not-shown resist film as a mask and reduction of the planar size of the resist film. The terrace portions 71a of the sacrificial layers 71 are exposed at the outermost surface of the stairstep portion 2. The terrace portions 71a are arranged to have differences in levels in the X-direction.

Figure 22:
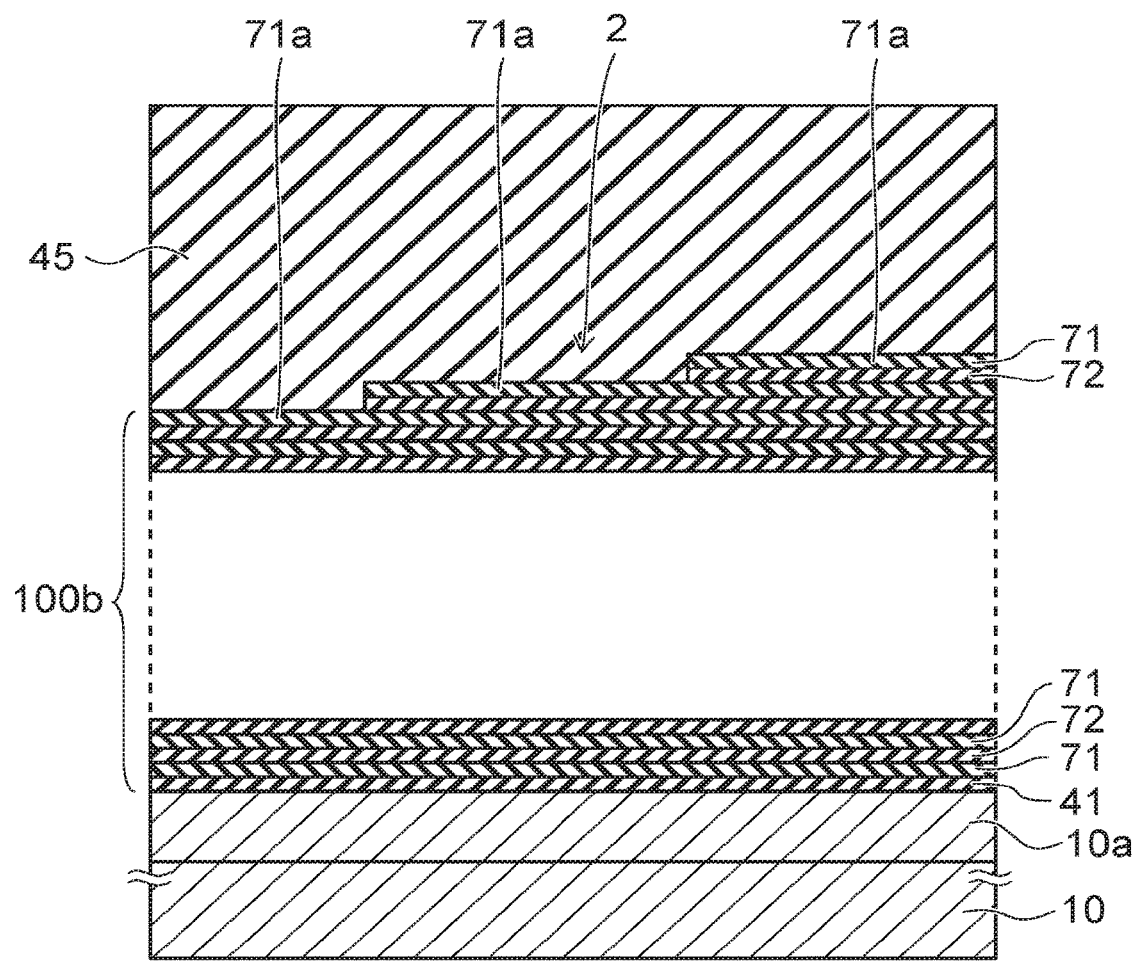

As shown in FIG. 22, the insulating layer 45 is formed on the stairstep portion 2. The insulating layer 45 buries the differences in levels of the stairstep portion 2; and the upper surface of the insulating layer 45 is planarized.

Figure 23:
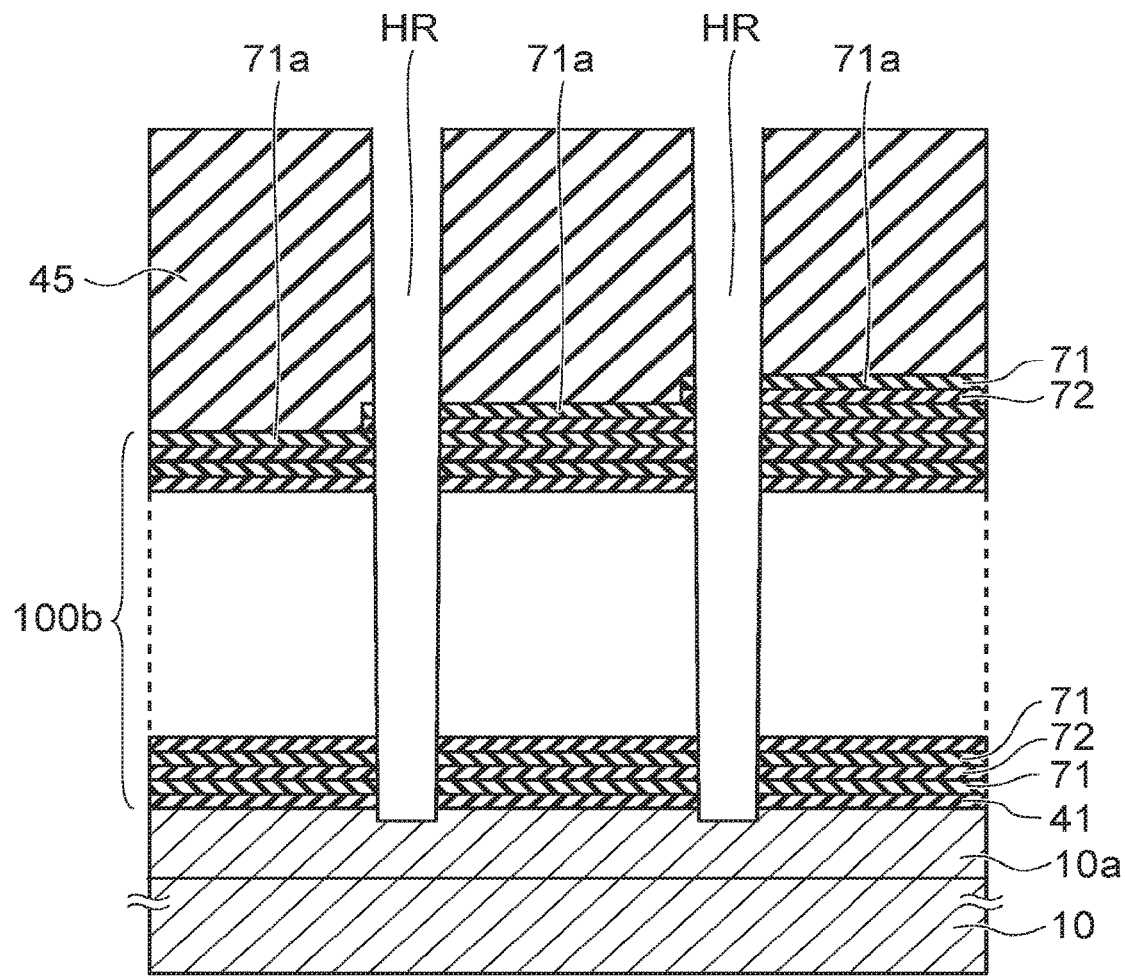

Then, as shown in FIG. 23, the plurality of holes HR are made in the insulating layer 45 and the second stacked unit 100b. The holes HR are made simultaneously when making the memory holes MH shown in FIG. 11. The memory holes MH and the holes HR are made simultaneously by RIE. The holes HR extend in the Z-direction through the insulating layer 45 and through the second stacked unit 100b and reach the active region 10a of the substrate 10.

Figure 24:
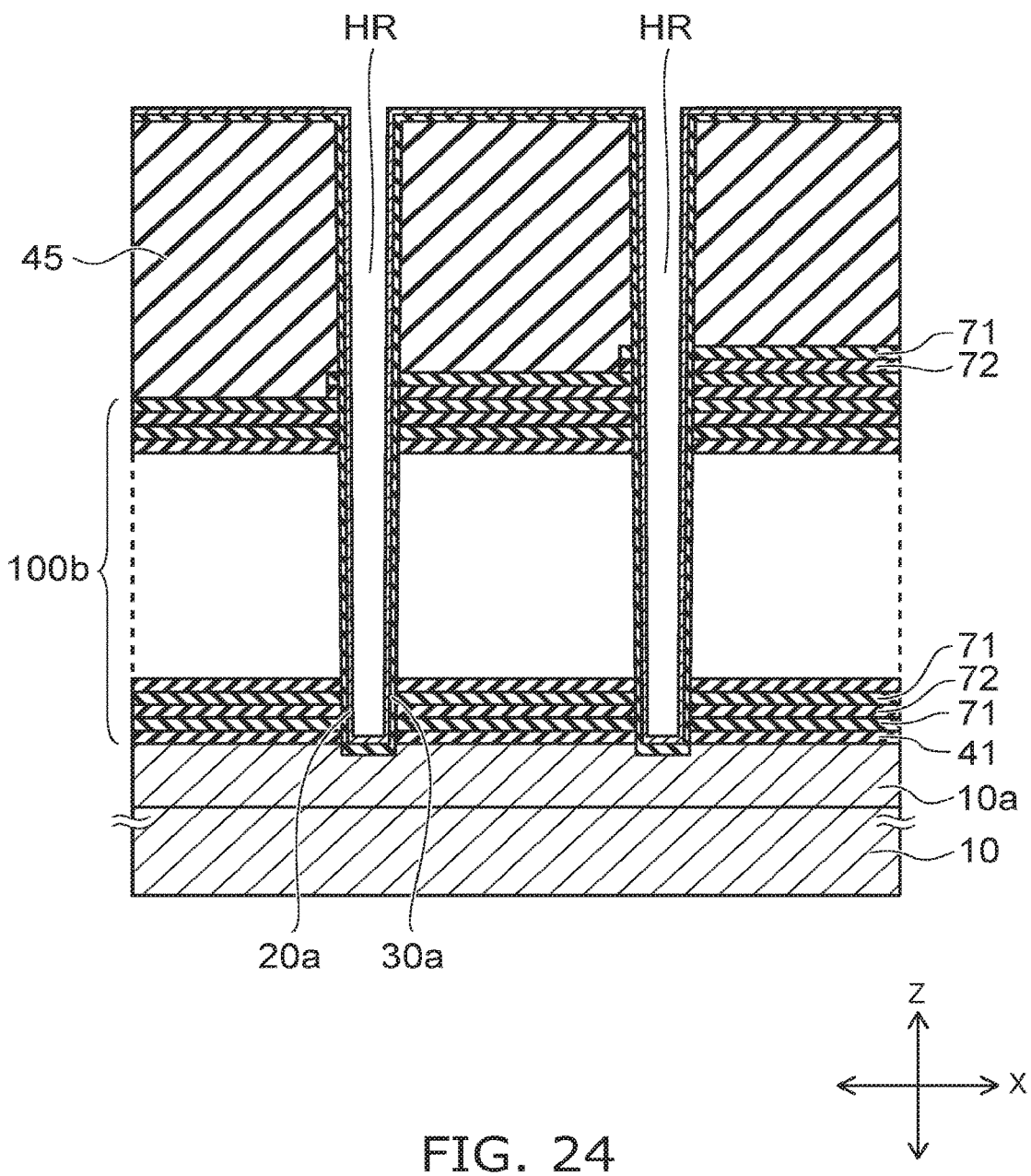

As shown in FIG. 24, the stacked film 30a and the cover silicon 20a are formed inside the holes HR. The stacked film 30a and the cover silicon 20a are formed simultaneously also inside the holes HR when forming the stacked film 30a and the cover silicon 20a inside the memory holes MH.

The stacked film 30a is formed conformally along the side surfaces and bottoms of the holes HR. The cover silicon 20a is formed on the inner side of the stacked film 30a. The cover silicon 20a also is formed conformally along the side surfaces and bottoms of the holes HR.

Figure 25:
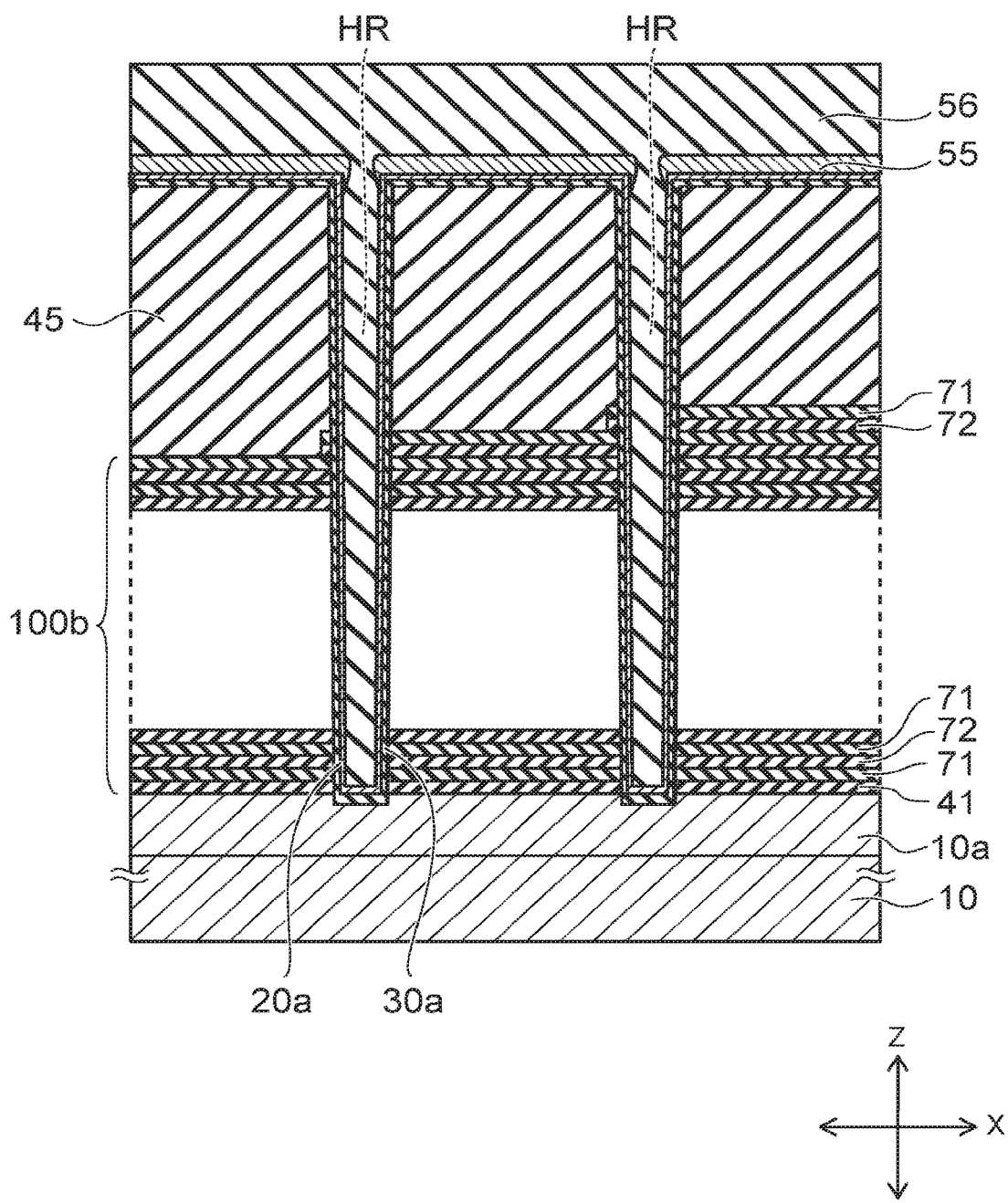

Subsequently, the mask layer 55 is formed on the first stacked unit 100a in the memory cell array region shown in FIG. 14 and on the insulating layer 45 in the peripheral region shown in FIG. 25. As shown in FIG. 25, a resist film 56 also is formed on the mask layer 55 in the peripheral region. The resist film 56 is buried in the holes HR.

After the resist film 56 is formed on the entire surface of the mask layer 55 in the memory cell array region and in the peripheral region of the memory cell array region, the resist film 56 in the memory cell array region shown in FIG. 14 is removed by exposing and developing the resist film 56. The resist film 56 that enters the memory holes MH also is removed. The resist film 56 remains inside the holes HR and on the mask layer 55 in the peripheral region shown in FIG. 25.

Then, as described above, the cover silicon 20a and the stacked film 30a at the bottoms of the memory holes MH shown in FIG. 14 are removed by RIE. At this time, the cover silicon 20a and the stacked film 30a at the bottoms of the holes HR shown in FIG. 25 are protected by the resist film 56 buried in the holes HR and are not etched.

Subsequently, the resist film 56 in the peripheral region is removed. Further, after removing the mask layer 55 in the memory cell array region and the peripheral region, the silicon body 20b is formed simultaneously inside the memory holes MH and inside the holes HR.

As described above, the lower end portion of the silicon body 20b contacts the active region 10a of the substrate 10 in the memory cell array region shown in FIG. 15.

Figure 26:
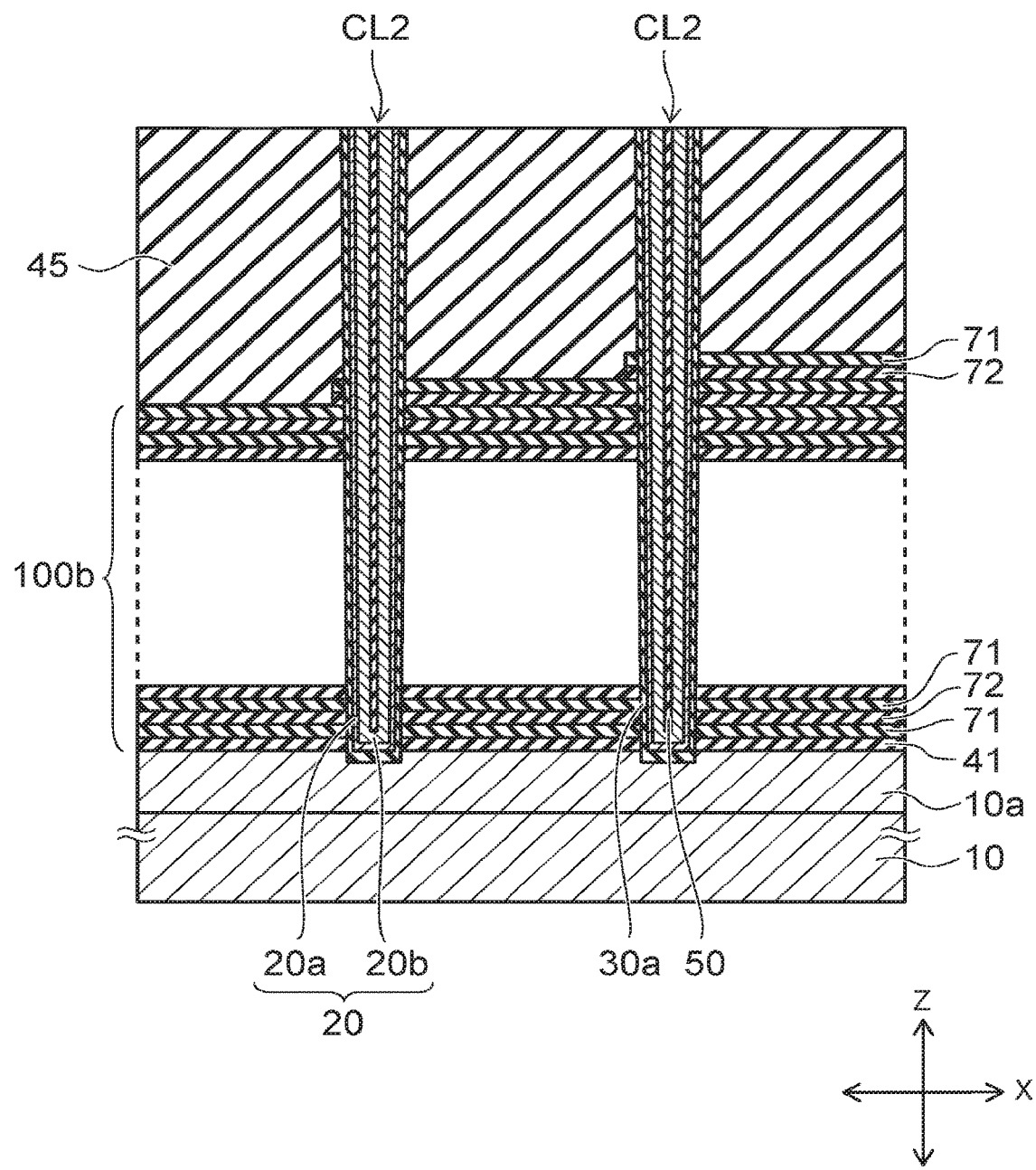

On the other hand, in the peripheral region, the stacked film 30a and the cover silicon 20a remain at the bottoms of the holes HR. Accordingly, as shown in FIG. 26, the lower end portion of the silicon body 20b formed inside the holes HR does not contact the active region 10a of the substrate 10. The stacked film 30a which is an insulating film is provided between the active region 10a of the substrate 10 and the lower end portion of the semiconductor body 20 inside the holes HR.

The core film 50 is formed simultaneously on the inner side of the silicon body 20b inside the memory holes MH and on the inner side of the silicon body 20b inside the holes HR.

Subsequently, as shown in FIG. 2, the slits ST that extend in the X-direction are made in the first stacked unit 100a and in the stacked body of the insulating layer 45 and the second stacked unit 100b. In the peripheral region as well, the bottoms of the slits ST reach the active region 10a of the substrate 10.

Then, the sacrificial layers 71 of the first stacked unit 100a and the sacrificial layers 71 of the second stacked unit 100b are removed by an etchant or an etching gas supplied through the slits ST.

Figure 27:
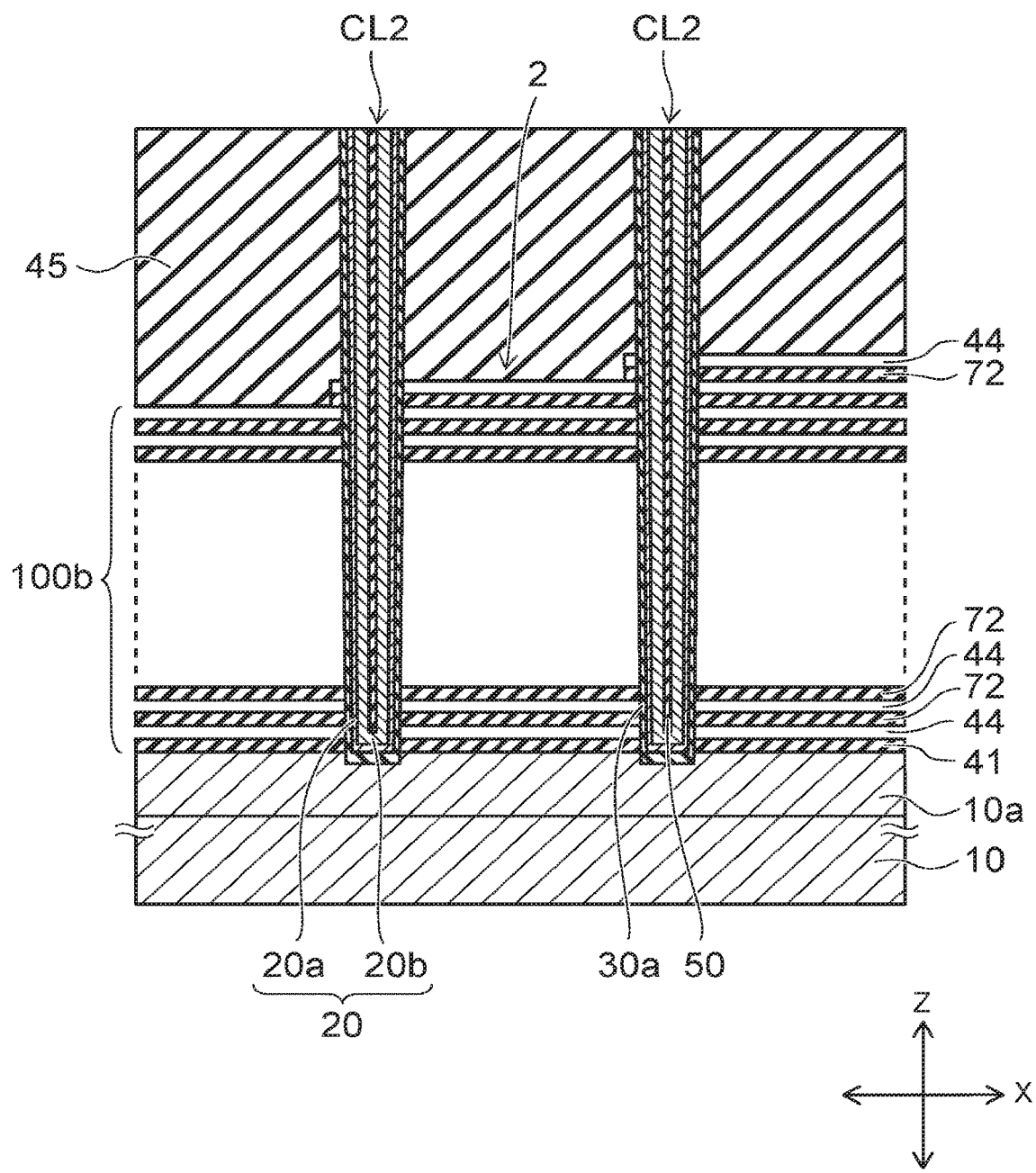

The sacrificial layers 71 in the peripheral region are removed; and as shown in FIG. 27, the gaps 44 are made between the insulating layers 72 adjacent to each other above and below. The gaps 44 are made also between the insulating layer 45 and the upper surface of the stairstep portion 2.

The insulating layers 72 of the second stacked unit 100b contact the side surfaces of the second columnar portions CL2 to surround the side surfaces of the second columnar portions CL2. The insulating layers 72 are supported by such a physical bond with the second columnar portions CL2; and the gaps 44 between the insulating layers 72 are maintained.

Figure 28:
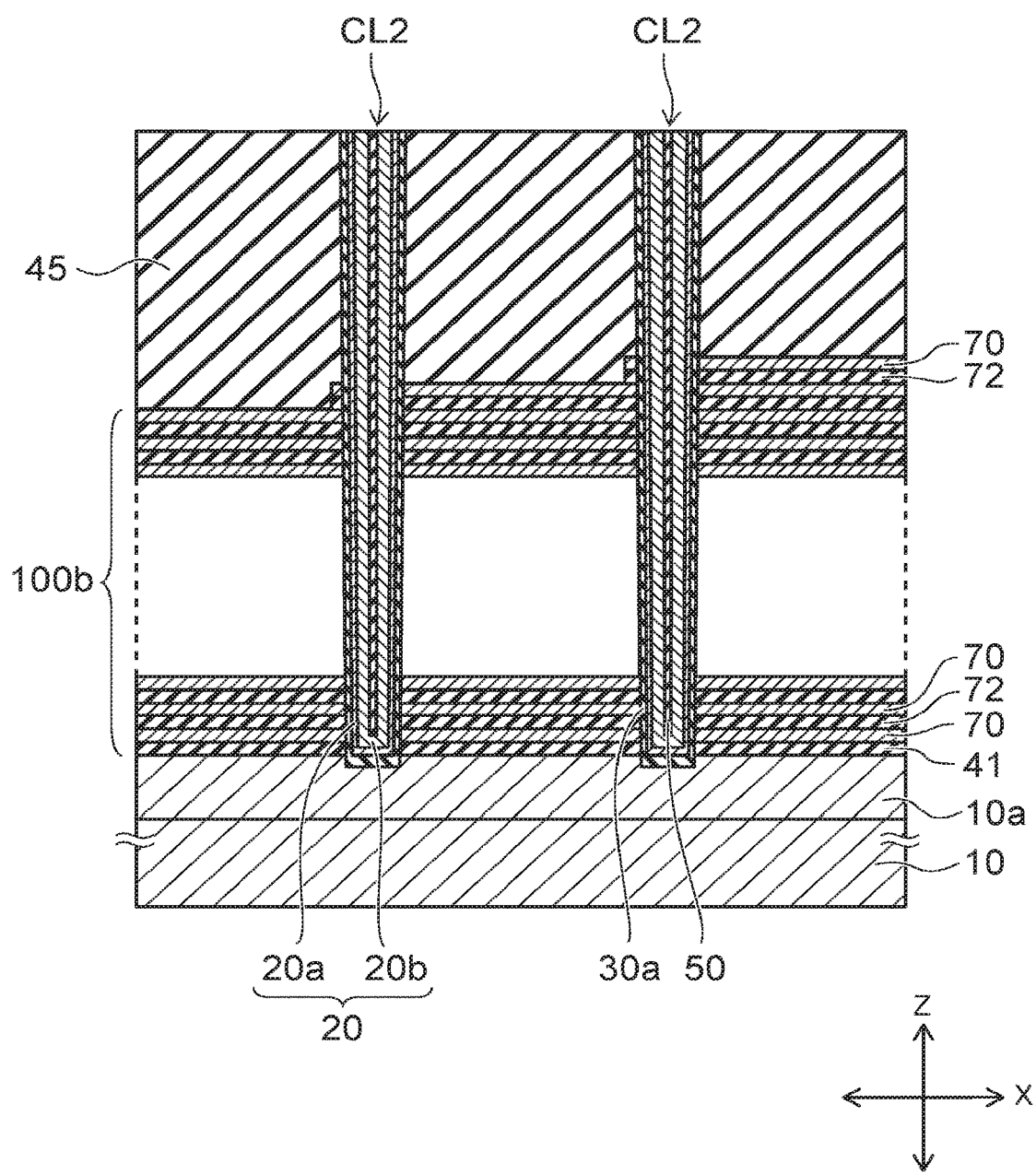

As shown in FIG. 28, the electrode layers 70 are formed in the gaps 44 of the second stacked unit 100b as well. Similarly to the first stacked unit 100a, the second blocking film 35 shown in FIG. 5 is interposed between the electrode layers 70 and the insulating layers 72, and between the electrode layers 70 and the second columnar portions CL2 of the second stacked unit 100b. The electrode layers 70 of the second stacked unit 100b are formed as one body with the electrode layers 70 of the first stacked unit 100a.

Subsequently, in the peripheral region as well, the interconnect portion LI is formed, with the insulating film 63 interposed, inside the slits ST.

Figure 29:
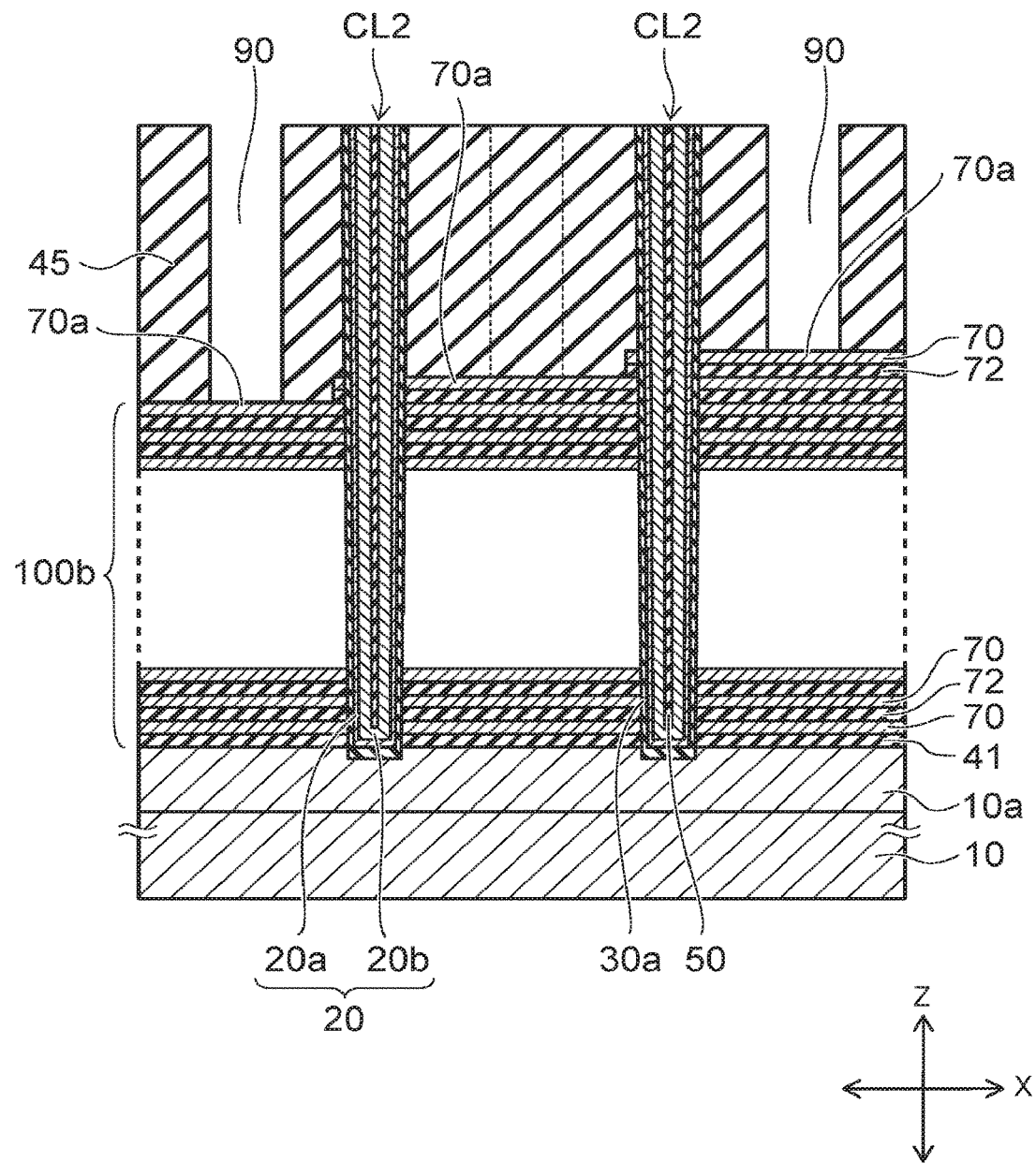

Further, the process of forming the contact via 91 in the peripheral region is continued. As shown in FIG. 29, a plurality of contact holes 90 are made in the insulating layer 45. The contact holes 90 pierce the insulating layer 45 and reach the terrace portions 70a of the electrode layers 70.

The contact vias 91 shown in FIG. 6 are formed by filling a conductive material that contains a metal inside the contact holes 90.

A hole pattern is formed by lithography in a not-shown resist film formed on the insulating layer 45; and the contact holes 90 are made by transferring the hole pattern onto the insulating layer 45.

There may be a case where the contact holes 90 shift to positions overlapping the second columnar portions CL2 due to the lithography precision for the resist film. In such a case, the contact vias 91 may contact the semiconductor bodies 20 of the second columnar portions CL2. This may cause electrical defects in which the contact vias 91 are shorted to the other contact vias 91 or the interconnect portion LI via the semiconductor bodies 20 and the active region 10a.

However, according to the embodiment, because the semiconductor bodies 20 of the second columnar portions CL2 do not contact the substrate 10, the shorts between the contact vias 91 and the shorts between the contact via 91 and the interconnect portion LI through the semiconductor bodies 20 can be prevented.

As one method for causing the lower end portion of the semiconductor body 20 not to contact the substrate 10, the resist film 56 is buried in the holes HR as shown in FIG. 25; and the stacked film 30a at the bottom of the holes HR is not removed.

It also may be considered to cause the resist film 56 to remain as-is so that the resist film 56 functions as posts when the gaps 44 shown in FIG. 27 are made. However, because the resist film 56 has no tolerance to the high-temperature heat treatment when activating or crystallizing the semiconductor bodies 20 formed inside the memory holes MH, the resist film 56 is removed after the RIE of the bottoms of the memory holes MH shown in FIG. 14.

After the removal of the resist film 56, the same film as the film formed inside the memory holes MH is formed inside the holes HR by the same process and caused to function as posts when the gaps 44 are made.

Figure 38:
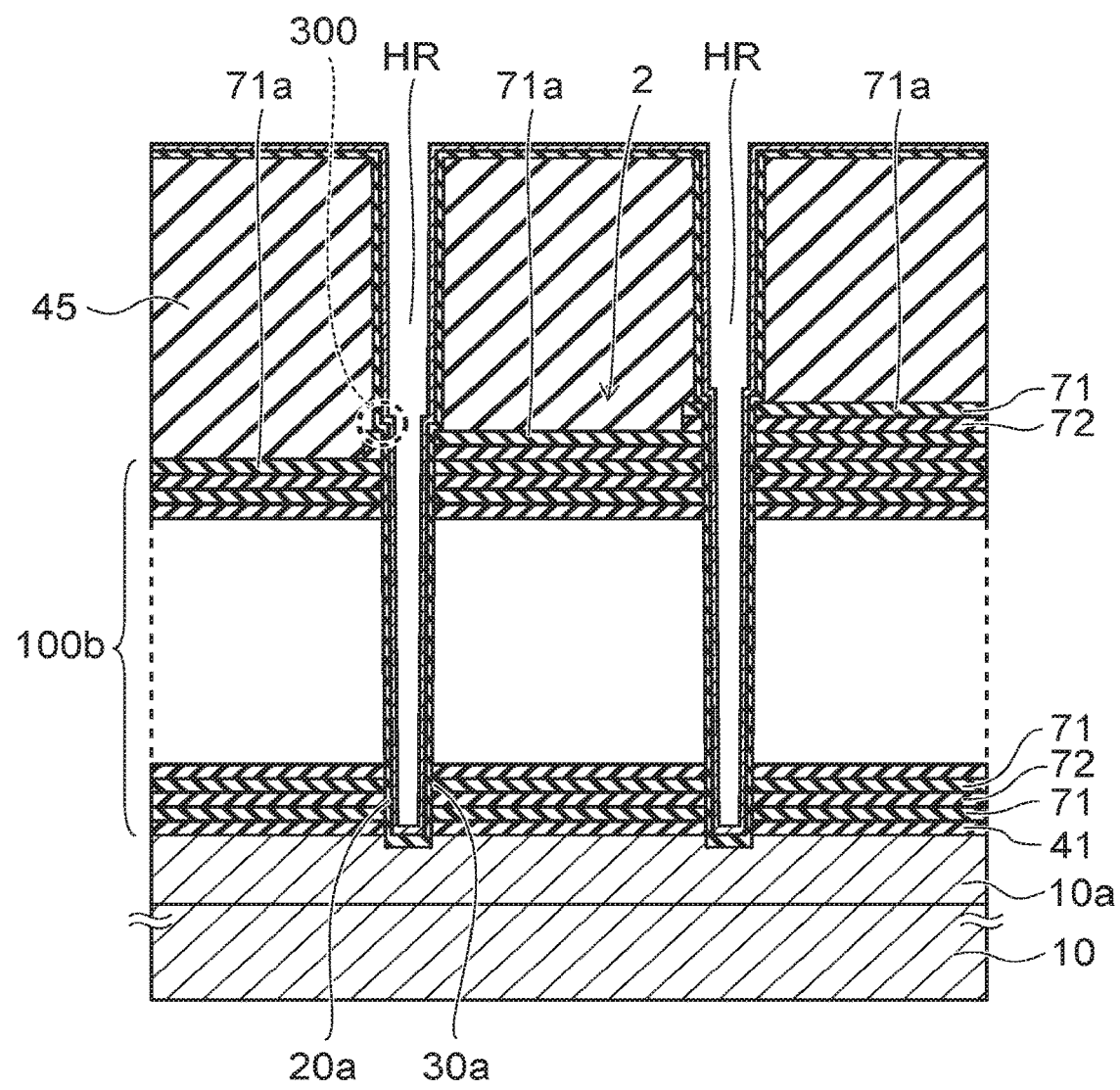
FIG. 38 is a schematic cross-sectional view showing a method for manufacturing a semiconductor device of a reference example.

The holes HR are made also inside the insulating layer 45 on the stairstep portion 2. In the RIE when making the holes HR, a difference in levels may be formed in the side surfaces of the holes HR as shown in FIG. 38 by the change of the etching object material properties and/or the etching conditions at the boundary between the insulating layer 45 and the second stacked unit 100b.

When the stacked film 30a and the cover silicon 20a are formed along the difference in levels, a stepped portion 300 is formed in the stacked film 30a and the cover silicon 20a as well. Because the stepped portion 300 juts toward the central axis side of the hole HR, if RIE of the bottom of the hole HR is performed in this state, the stacked film 30a and the cover silicon 20a at the stepped portion 300 are etched easily. If the stacked film 30a at the stepped portion 300 is removed, the silicon body 20b is formed directly on the side surface of the hole HR. Then, when the sacrificial layers 71 are replaced with the electrode layers 70 in a subsequent process, the silicon body 20b and the electrode layers 70 may be shorted.

However, according to the embodiment, the resist film 56 is buried in the hole HR as shown in FIG. 25; and RIE is not performed in the hole HR interior. Therefore, even in the case where the stepped portion 300 such as that shown in FIG. 38 is formed in the side surface of the hole HR, the stepped portion 300 is not etched. Accordingly, a portion of the side surface of the hole HR where the stacked film 30a is removed is not formed; and the shorts between the silicon body 20b and the electrode layers 70 can be prevented.

Another method for preventing the contact between the lower end portion of the semiconductor body 20 of the second columnar portion CL2 and the active region 10a of the substrate 10 will now be described.

Figure 30:
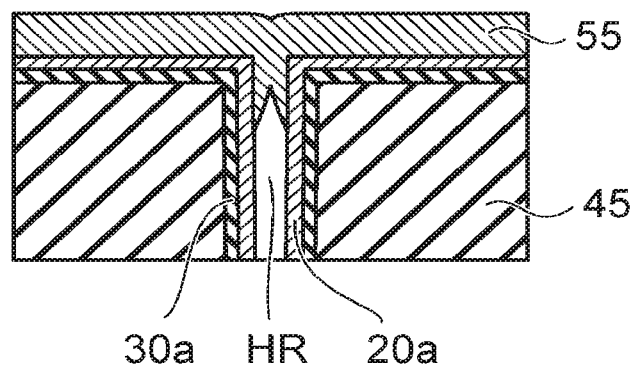

By setting the diameter of the upper end portion of the hole HR to be smaller than the diameter of the upper end portion of the memory hole MH, the opening of the hole HR can be plugged by the mask layer 55 as shown in FIG. 30. As shown in FIG. 14, the opening of the memory hole MH is not plugged by the mask layer 55. By appropriately controlling the difference between the diameter of the upper end portion of the memory hole MH and the diameter of the upper end portion of the hole HR, the mask layer 55 that plugs the opening of the hole HR without plugging the opening of the memory hole MH can be formed.

Even in the case where the resist film 56 shown in FIG. 25 is not formed, the RIE of the bottom of the hole HR can be prevented by the mask layer 55 shown in FIG. 30.

The diameter of the upper end portion of the second columnar portion CL2 is smaller than the diameter of the upper end portion of the first columnar portion CL1 because the diameter of the upper end portion of the hole HR is smaller than the diameter of the upper end portion of the memory hole MH.

The difference between the diameter of the hole HR and the diameter of the memory hole MH can be caused to correspond to the difference between the surface area of the horizontal cross section of the hole HR and the surface area of the horizontal cross section of the memory hole MH. The difference between the diameter of the second columnar portion CL2 and the diameter of the first columnar portion CL1 can be caused to correspond to the difference between the surface area of the horizontal cross section of the second columnar portion CL2 and the surface area of the horizontal cross section of the first columnar portion CL1.

As still another method for preventing the contact between the active region 10a and the lower end portion of the semiconductor body 20 of the second columnar portion CL2, the diameter of the bottom of the hole HR is set to be smaller than the diameter of the bottom of the memory hole MH.

Figure 9A:
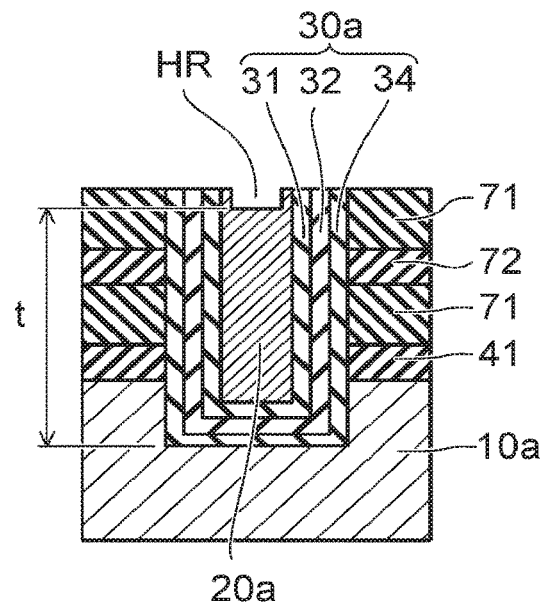
Figure 9B:
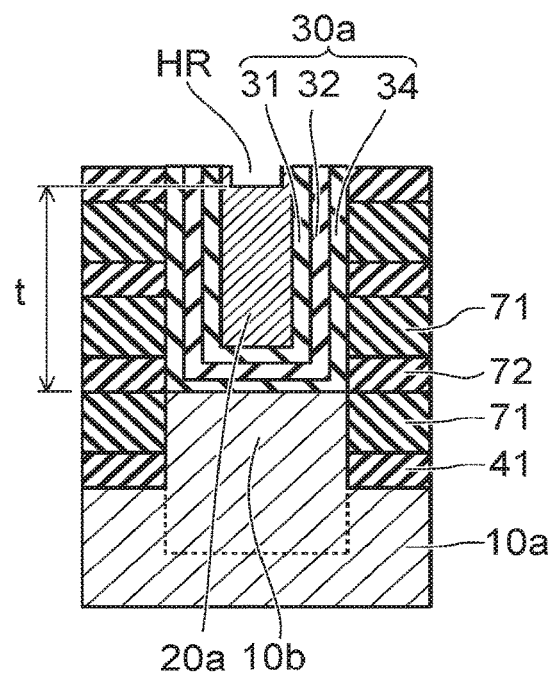

The thickness t of the deposition films (the stacked film 30a and the cover silicon 20a) on the bottom of the hole HR shown in FIG. 9A or FIG. 9B, which has a diameter that is smaller than that of the memory hole MH, is thicker than the thickness of the deposition films (the stacked film 30a and the cover silicon 20a) on the bottom of the memory hole MH.

Therefore, when the RIE is performed simultaneously on the bottom of the memory hole MH and the bottom of the hole HR, it is possible to cause all or a portion of the stacked film 30a which is the insulating film on the bottom of the hole HR to remain even when the deposition films at the bottom of the memory hole MH are consumed.

Even in the case where the opening or interior of the hole HR are not protected by the mask layer 55 or the resist film 56, it is possible to interpose the insulating film between the silicon body 20b and the active region 10a of the substrate 10.

The diameter of the lower end portion of the second columnar portion CL2 is smaller than the diameter of the lower end portion of the first columnar portion CL1 because the diameter of the bottom of the hole HR is smaller than the diameter of the bottom of the memory hole MH.

Also, it is possible to cause the cover silicon 20a that is thicker than the thickness of the lower end portion of the silicon body 20b of the first columnar portion CL1 to remain on the bottom of the hole HR. Accordingly, the thickness of the lower end portion of the semiconductor body 20 of the second columnar portion CL2 can be set to be thicker than the thickness of the lower end portion of the semiconductor body 20 of the first columnar portion CL1.

Another structure example of the peripheral region will now be described.

Figure 31A:
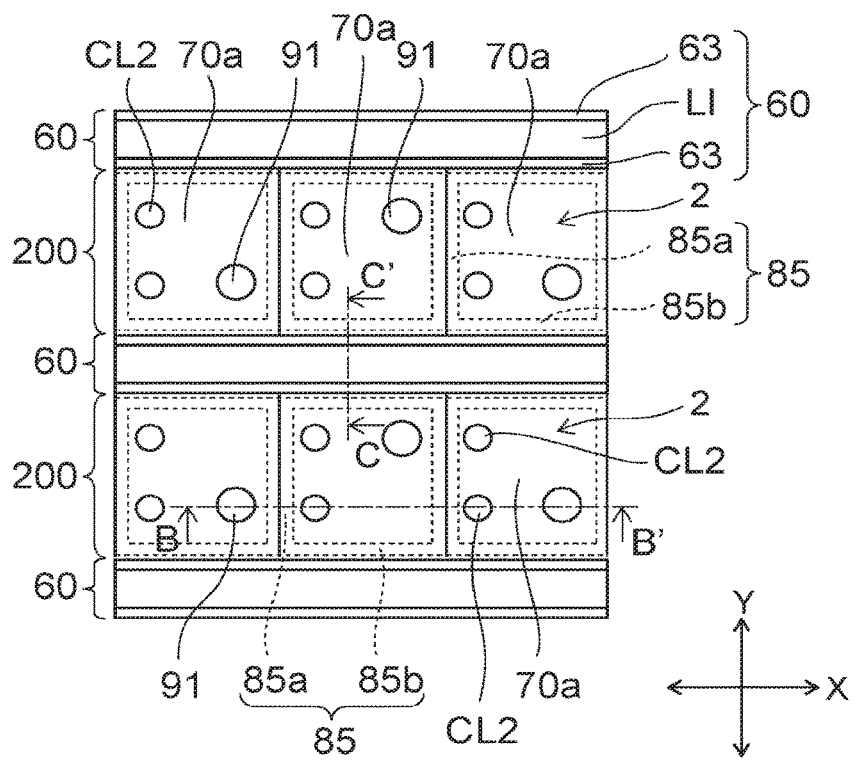
FIGS. 31A to 32B are schematic plan views of the stairstep portion of the embodiment.

FIG. 31A is a schematic plan view of the peripheral region.

Figure 33:
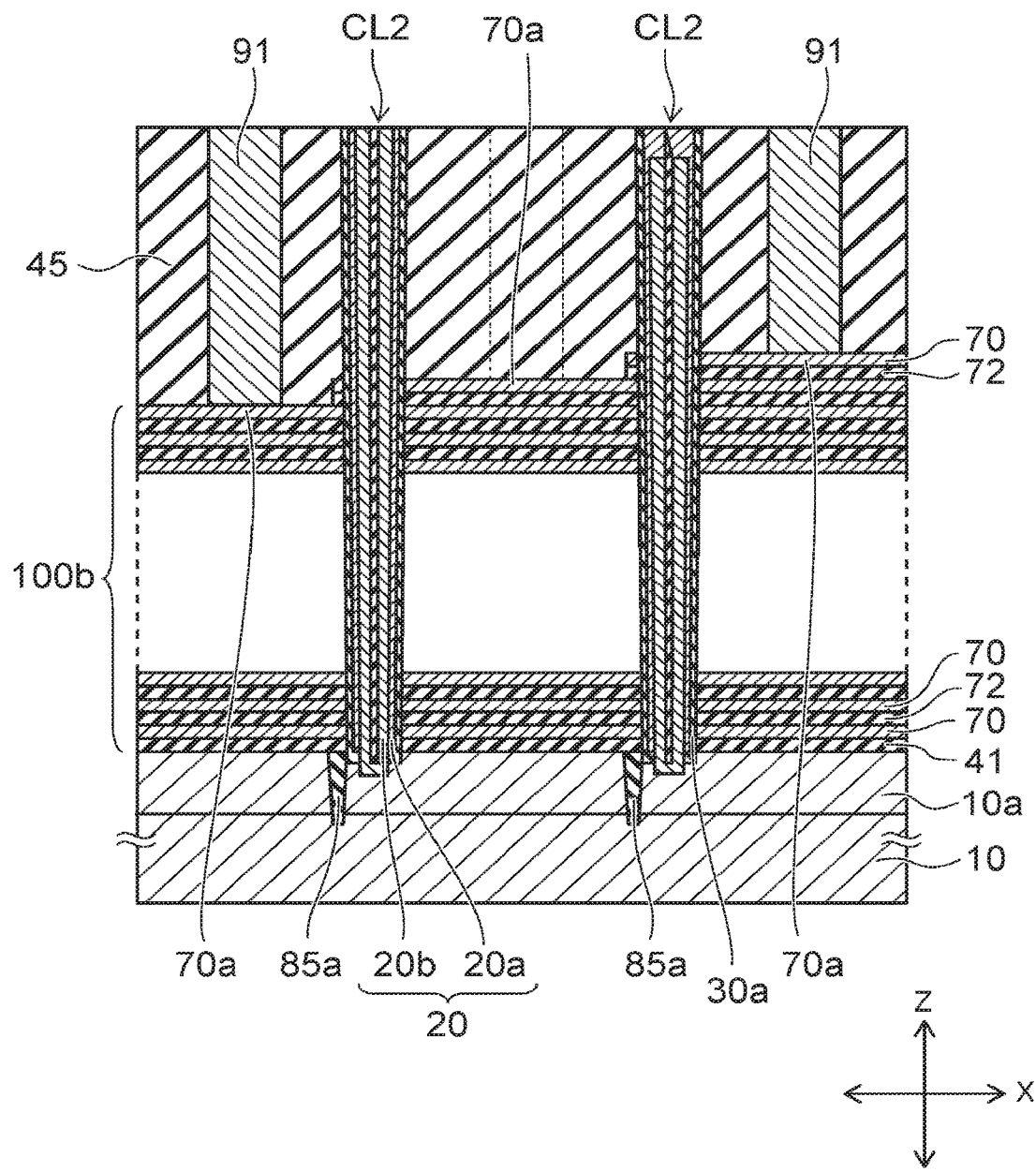
FIG. 33 is a B-B' cross-sectional view of FIG. 31A.

FIG. 33 is a B-B' cross-sectional view of FIG. 31A.

Figure 34:
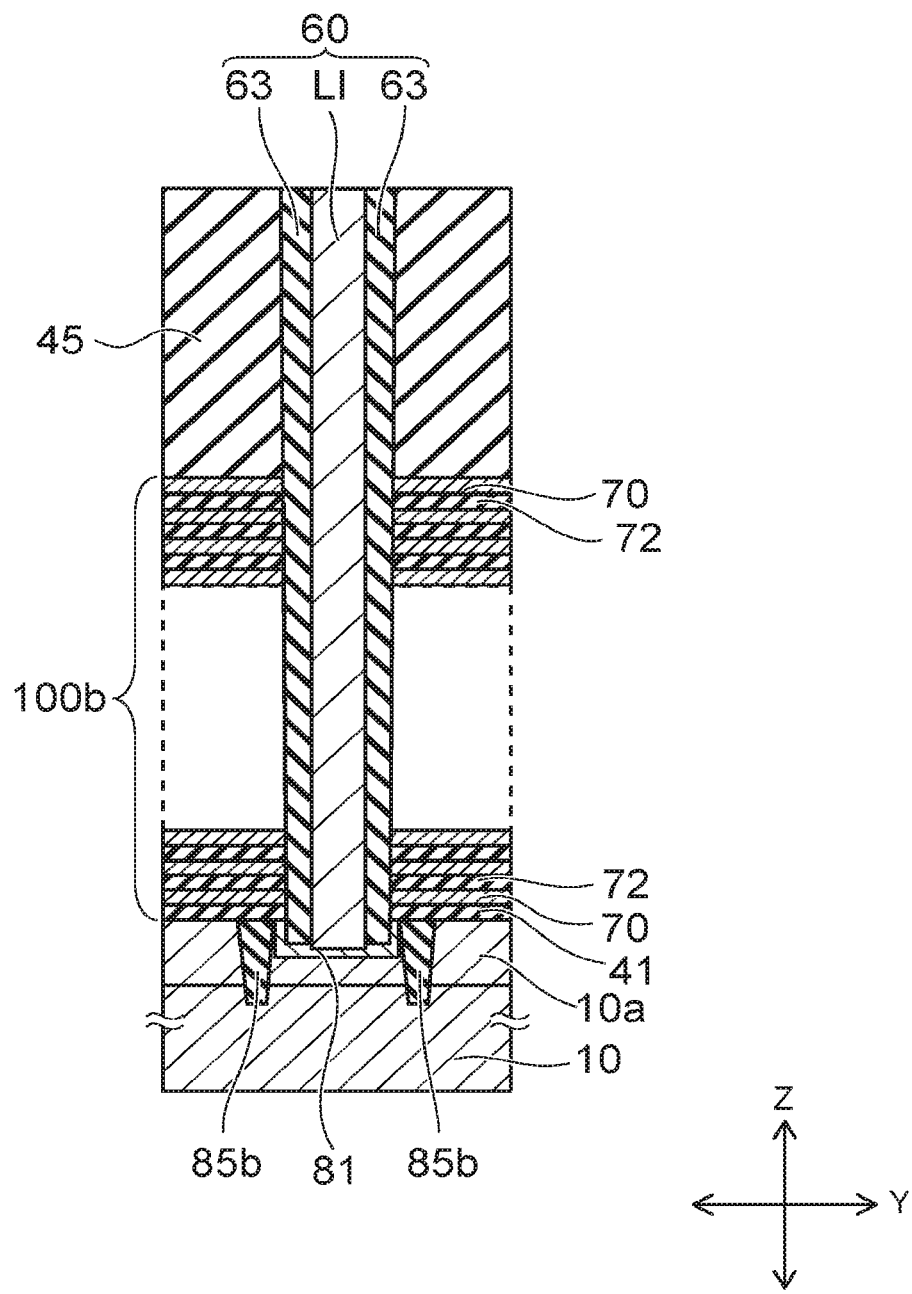
FIG. 34 is a C-C' cross-sectional view of FIG. 31A.

FIG. 34 is a C-C' cross-sectional view of FIG. 31A.

As shown in FIG. 33, the lower end portion of the semiconductor body 20 of the second columnar portion CL2 contacts the active region 10a of the substrate 10.

Figure 36:
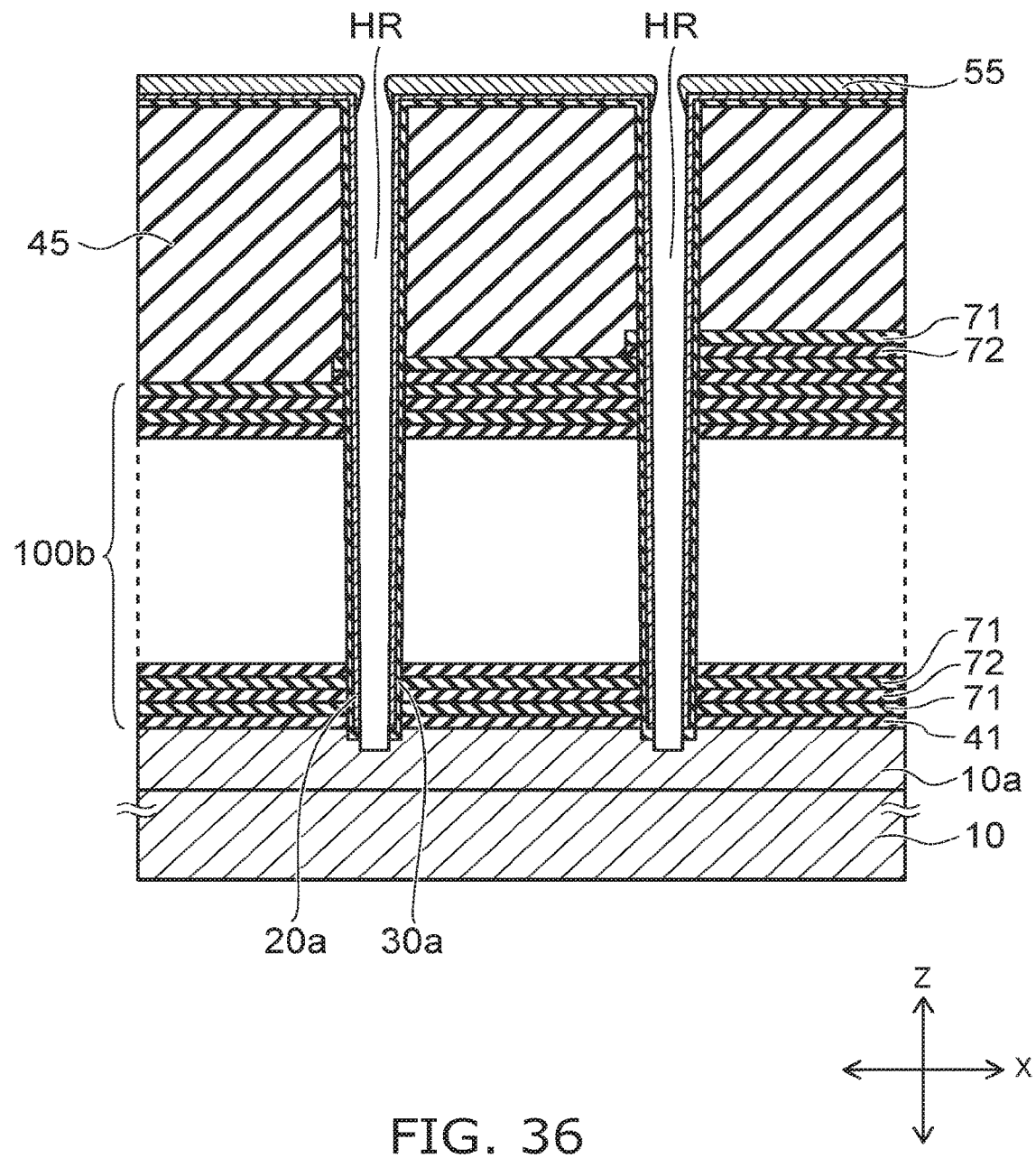
FIG. 36 is a schematic cross-sectional view showing a method for manufacturing the semiconductor device of the embodiment.

In the RIE shown in FIG. 14 that removes the deposition films (the stacked film 30a and the cover silicon 20a) on the bottom of the memory hole MH, the deposition films (the stacked film 30a and the cover silicon 20a) on the bottom of the hole HR also are removed as shown in FIG. 36. Subsequently, the silicon body 20b is formed inside the hole HR; and the lower end portion of the silicon body 20b contacts the active region 10a of the substrate 10.

An insulating portion 85 is formed as illustrated by broken lines in FIG. 31A in such an active region 10a of the peripheral region where the second columnar portions CL2 are disposed. The insulating portion 85 includes a first insulating portion 85a extending in the Y-direction and a second insulating portion 85b extending in the X-direction. The cross section of the first insulating portion 85a is shown in FIG. 33; and the cross section of the second insulating portion 85b is shown in FIG. 34.

The insulating portion 85 has a shallow trench isolation (STI) structure in which an insulating film is buried in a trench made in the active region 10a. As shown in FIG. 33 and FIG. 34, the lower end of the first insulating portion 85a and the lower end of the second insulating portion 85b are at positions deeper than the active region 10a.

The first insulating portion 85a extends under the boundary of the terrace portions 70a along the boundary. The second insulating portion 85b extends along the X-direction at the side of two sides of the lower end portion of the interconnect portion LI contacting the active region 10a.

The first insulating portion 85a and the second insulating portion 85b are continuous. The insulating portion 85 divides the active region 10a into a plurality of regions in the X-direction and the Y-direction. The insulating portion 85 continuously surrounds the active region 10a in the X-direction and the Y-direction under the terrace portion 70a every one terrace portion 70a of one block 200.

The first insulating portion 85a is provided at a position that breaks the electrical connection via the active region 10a between the semiconductor bodies 20 of the second columnar portions CL2 disposed in the terrace portions 70a of different levels.

Accordingly, even in the case where the contact via 91 and the semiconductor body 20 of the second columnar portion CL2 disposed in the same terrace portion 70a contact each other, the contact vias 91 disposed in the terrace portions 70a of different levels are not shorted to each other via the semiconductor bodies 20 and the active region 10a. The electrode layers 70 of different layers are not shorted to each other by the contact vias 91, the semiconductor bodies 20, and the active region 10a.

The second insulating portion 85b is provided at a position that breaks the electrical connection via the active region 10a between the interconnect portion LI and the semiconductor body 20 of the second columnar portion CL2. Further, the second insulating portion 85b is provided at a position that breaks the electrical connection via the active region 10a between the semiconductor bodies 20 of the second columnar portions CL2 of different blocks 200.

Accordingly, even in the case where the contact via 91 contacts the semiconductor body 20 of the second columnar portion CL2, the contact via 91 is not shorted to the interconnect portion LI via the semiconductor body 20 and the active region 10a. The electrode layer 70 is not shorted to the interconnect portion LI via the contact via 91, the semiconductor body 20, and the active region 10a. The contact vias 91 of different blocks 200 are not shorted to each other via the semiconductor bodies 20 and the active region 10a. The electrode layers 70 of different blocks 200 are not shorted to each other via the semiconductor bodies 20 and the active region 10a.

Figure 31B:
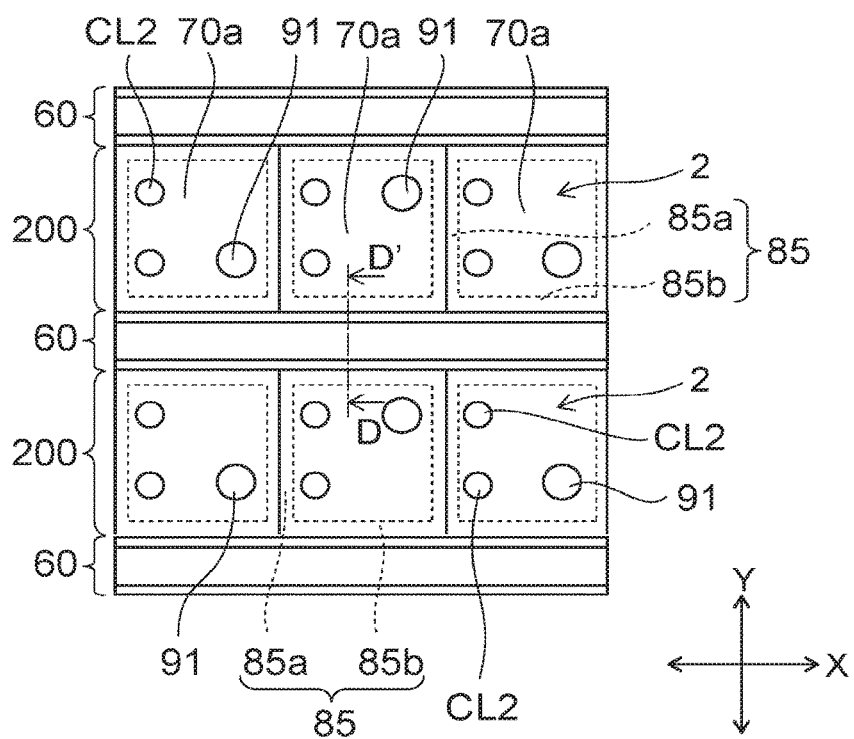

FIG. 31B is a schematic plan view showing another planar layout of the insulating portion 85.

Figure 35:
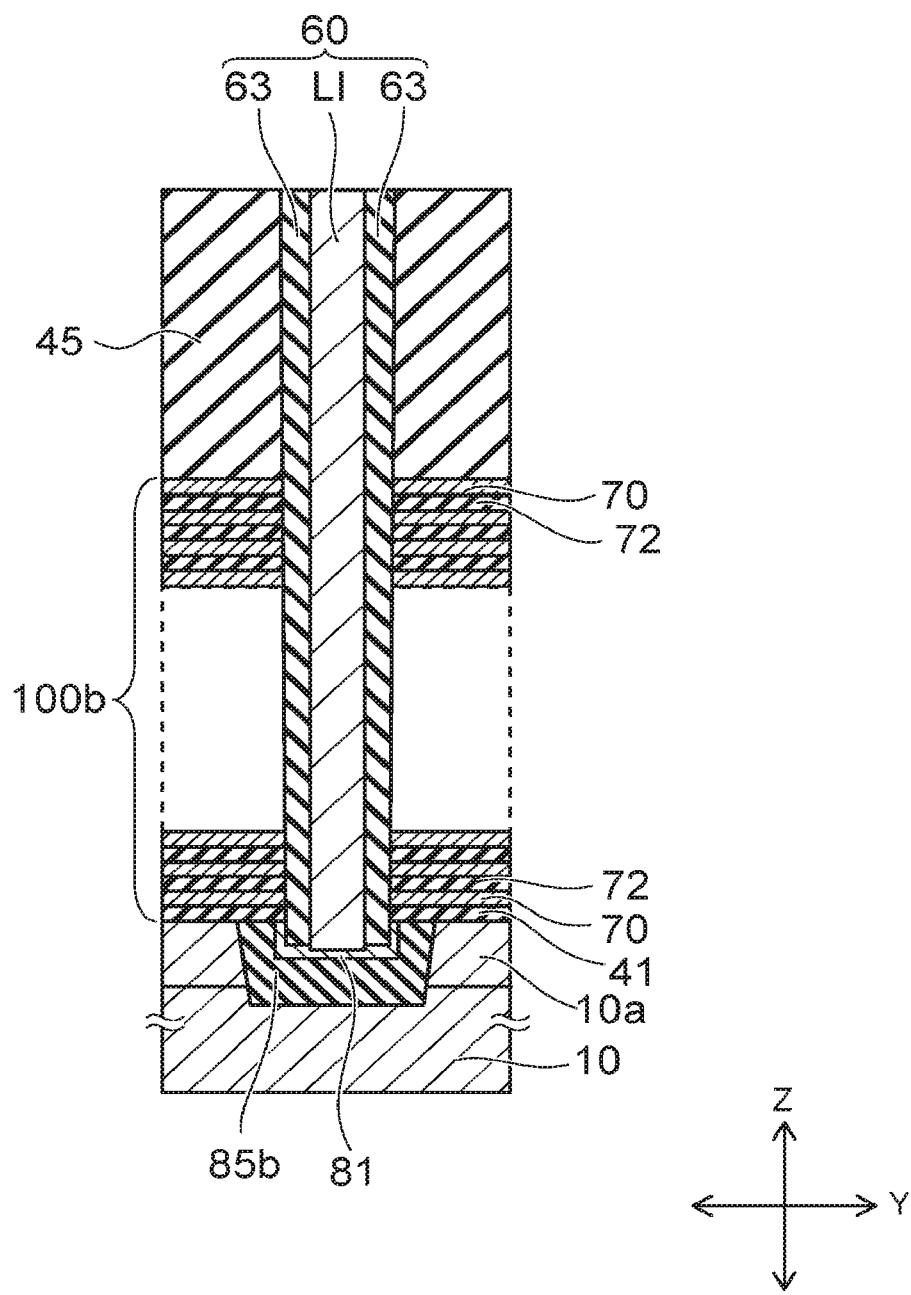
FIG. 35 is a D-D' cross-sectional view of FIG. 31B.

FIG. 35 is a D-D' cross-sectional view of FIG. 31B.

As shown in FIG. 35, the second insulating portion 85b may be provided under the interconnect portion LI with a width wider than the interconnect portion LI to cover the lower end portion of the interconnect portion LI. The lower end of the second insulating portion 85b is at a position deeper than the active region 10a. The lower end portion of the interconnect portion LI in the peripheral region contacts the second insulating portion 85b but does not contact the active region 10a. The interconnect portion LI and the semiconductor body 20 of the second columnar portion CL2 are not shorted via the active region 10a.

Figure 32A:
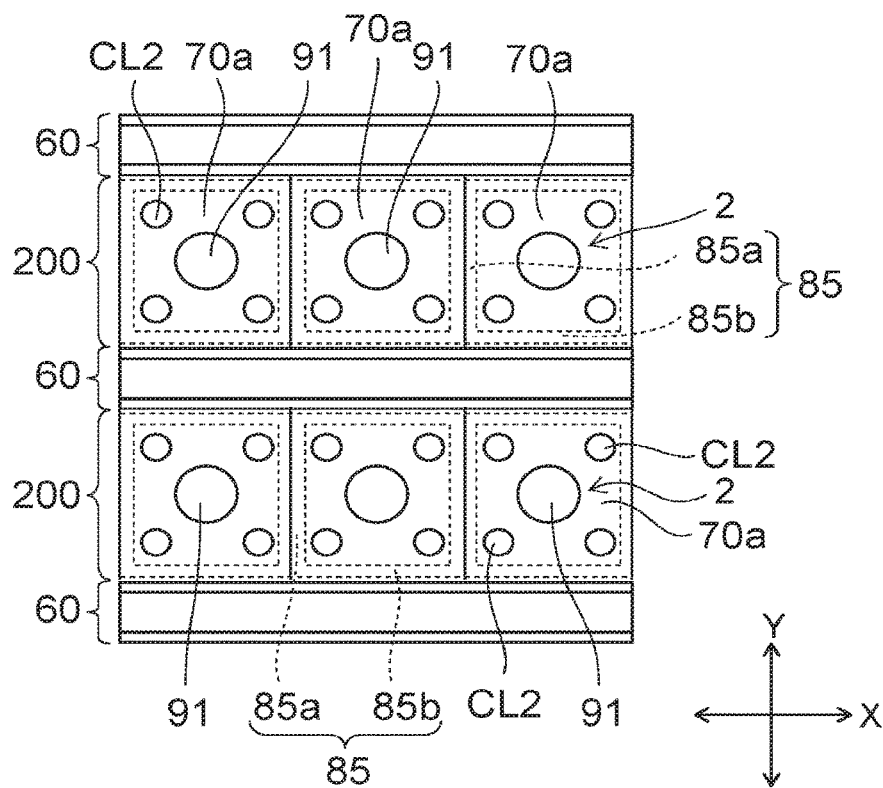

FIG. 32A is a schematic plan view showing another arrangement example of the contact via 91 and the second columnar portion CL2.

In the example shown in FIG. 32A, one contact via 91 and four second columnar portions CL2 are disposed every one terrace portion 70a. For example, the four second columnar portions CL2 are arranged at uniform spacing at the periphery of the contact via 91.

In such a case as well, the first insulating portion 85a prevents shorts via the semiconductor bodies 20 and the active region 10a between the contact vias 91 disposed in the terrace portions 70a of different levels. The second insulating portion 85b prevents shorts via the semiconductor body 20 and the active region 10a between the contact via 91 and the interconnect portion LI. The second insulating portion 85b prevents shorts via the active region 10a between the semiconductor bodies 20 of different blocks 200.

The first insulating portions 85a are repeated in the X-direction at a pitch corresponding to the pitch of the terrace portions 70a arranged in the X-direction. In the example shown in FIG. 31A, FIG. 31B, and FIG. 32A, the first insulating portion 85a is provided every boundary of the terrace portions 70a; and the pitch of the boundaries of the terrace portions 70a matches the pitch of the first insulating portions 85a. The pitch in the X-direction of the terrace portions 70a is not limited to a uniform pitch.

The first insulating portion 85a is not limited to being disposed under the boundary of the terrace portions 70a.

Figure 32B:
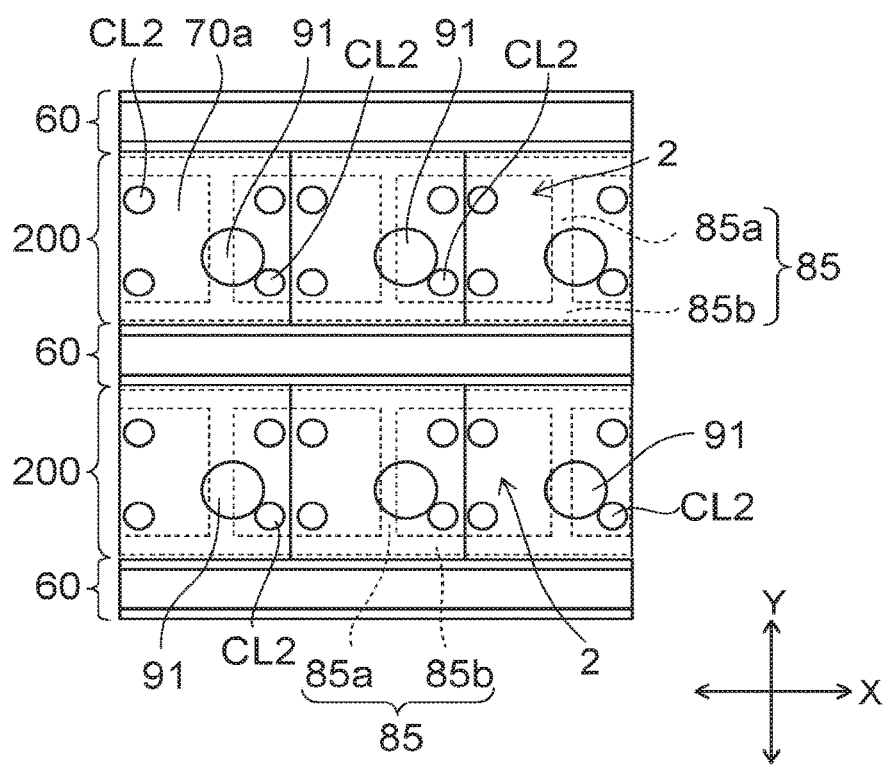

FIG. 32B shows another layout of the first insulating portion 85a.

The first insulating portions 85a are disposed at positions shifted in the X-direction from under the boundaries of the terrace portions 70a, and are arranged in the X-direction at a pitch corresponding to the pitch of the terrace portions 70a arranged in the X-direction. The number of the plurality of regions divided by the first insulating portion 85a in the active region 10a corresponds to the number of the plurality of terrace portions 70a.

Also, FIG. 32B shows an example in which the contact via 91 contacts the second columnar portion CL2 in the same terrace portion 70a in the example in which one contact via 91 and four second columnar portions CL2 at the periphery of the one contact via 91 are disposed every one terrace portion 70a similarly to FIG. 32A.

The example is illustrated in which the position of the contact via 91 is shifted in, for example, the rightward diagonally-downward direction from the position shown in FIG. 32A due to the positional shift in the lithography of the contact hole pattern; and the contact via 91 contacts the second columnar portion CL2 as shown in FIG. 32B. In FIG. 32B, the contact via 91 contacts the semiconductor body 20 of the second columnar portion CL2 rightward diagonally-downward.

In FIG. 32B, a terrace portion relatively on the left side of two terrace portions 70a adjacent to each other in the X-direction is taken as a first terrace portion; and a terrace portion on the right side is taken as a second terrace portion. The second terrace portion is adjacent to the first terrace portion on one side (the right side) in the X-direction.

A contact via of the contact vias 91 disposed in the first terrace portion is taken as a first contact via; and a contact via of the contact vias 91 disposed in the second terrace portion is taken as a second contact via.

When positional shift of the hole patterns occurs in the lithography, there is a tendency for the hole patterns to shift in the same direction (in the example shown in FIG. 32B, the rightward diagonally-downward direction).

Accordingly, in the example shown in FIG. 32B, the first contact via contacts the semiconductor body 20 of the second columnar portion CL2 rightward diagonally-downward from the first contact via; and the second contact via contacts the semiconductor body 20 of the second columnar portion CL2 rightward diagonally-downward from the second contact via.

The first insulating portion 85a is provided at a position that partitions, in the X-direction, the active region 10a between the second columnar portion CL2 contacting the first contact via in the first terrace portion and the second columnar portion CL2 contacting the second contact via in the second terrace portion.

Accordingly, the first insulating portion 85a can block the shorts via the semiconductor bodies 20 and the active region 10a between the first contact via disposed in the first terrace portion and the second contact via disposed in the second terrace portion of a level different from that of the first terrace portion.

Figure 37:
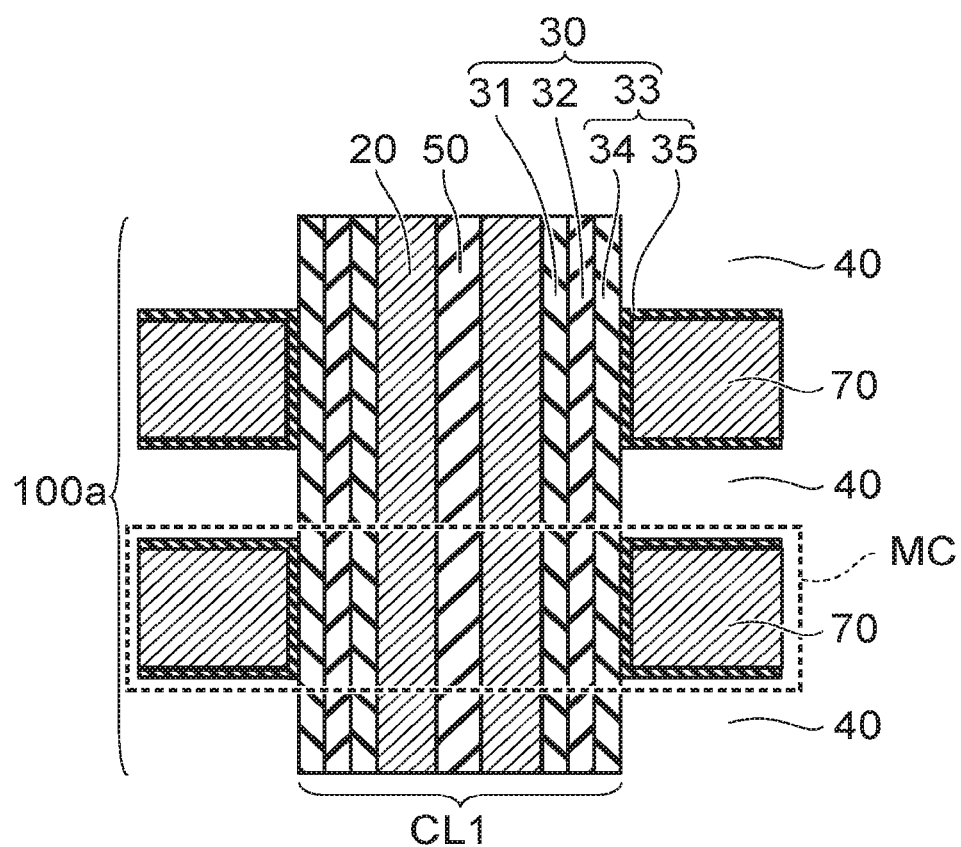
FIG. 37 is a schematic cross-sectional view showing another example of the memory cell array of the embodiment.

FIG. 37 is a schematic cross-sectional view showing another example of the first stacked unit 100a.

An air gap 40 is made as an insulator between the electrode layers 70 which are the control gates of the memory cells MC adjacent to each other in the stacking direction. Therefore, the interconnect capacitance between the electrode layers 70 above and below can be reduced; and high-speed operations of the memory cells MC are possible. Further, the interference between adjacent cells such as threshold fluctuation due to the capacitive coupling between the electrode layers 70 above and below, etc., can be suppressed.

The air gaps 40 can be made between the electrode layers 70 by removing the insulating layers 72 by etching through the slits ST after forming the electrode layers 70 in the process shown in FIG. 19 described above. For example, the insulating layers 72 which are silicon oxide layers can be removed using an etchant containing hydrofluoric acid.

Figure 39:
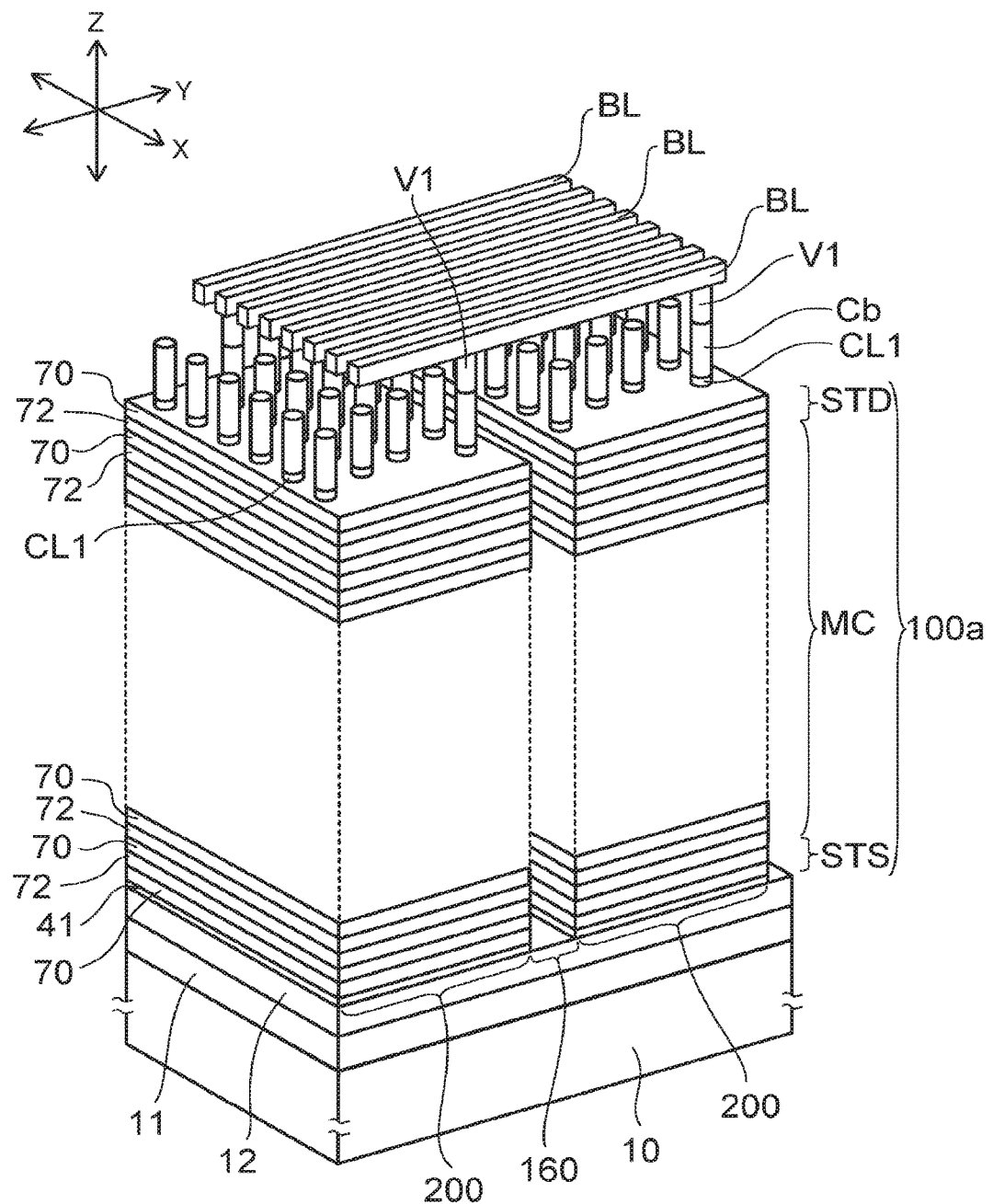
FIG. 39 is a schematic perspective view showing another example of the memory cell array of the embodiment.

FIG. 39 is a schematic perspective view showing another example of the memory cell array of the embodiment.

A first foundation layer 11 and a second foundation layer 12 are provided between the substrate 10 and a stacked body 100. The first foundation layer 11 is provided between the substrate 10 and the second foundation layer 12; and the second foundation layer 12 is provided between the first foundation layer 11 and the stacked body 100.

The second foundation layer 12 is a semiconductor layer or a conductive layer. Or, the second foundation layer 12 may include a stacked film of a semiconductor layer and a conductive layer.

The first foundation layer 11 includes transistors and interconnects of the control circuit.

The lower ends of the semiconductor bodies 20 of the first columnar portions CL1 contact the second foundation layer 12; and the second foundation layer 12 is connected to the control circuit. Accordingly, the lower ends of the semiconductor bodies 20 of the first columnar portions CL1 are electrically connected to the control circuit via the second foundation layer 12. The second foundation layer 12 can be used as a source layer.

The first stacked unit 100a in the memory cell array region is divided into the plurality of blocks (or finger portions) 200 in the Y-direction by a separation portion 160. The second stacked unit 100b in the peripheral region also is divided into the plurality of blocks (or finger portions) 200 in the Y-direction by the separation portion 160.

Figure 40:
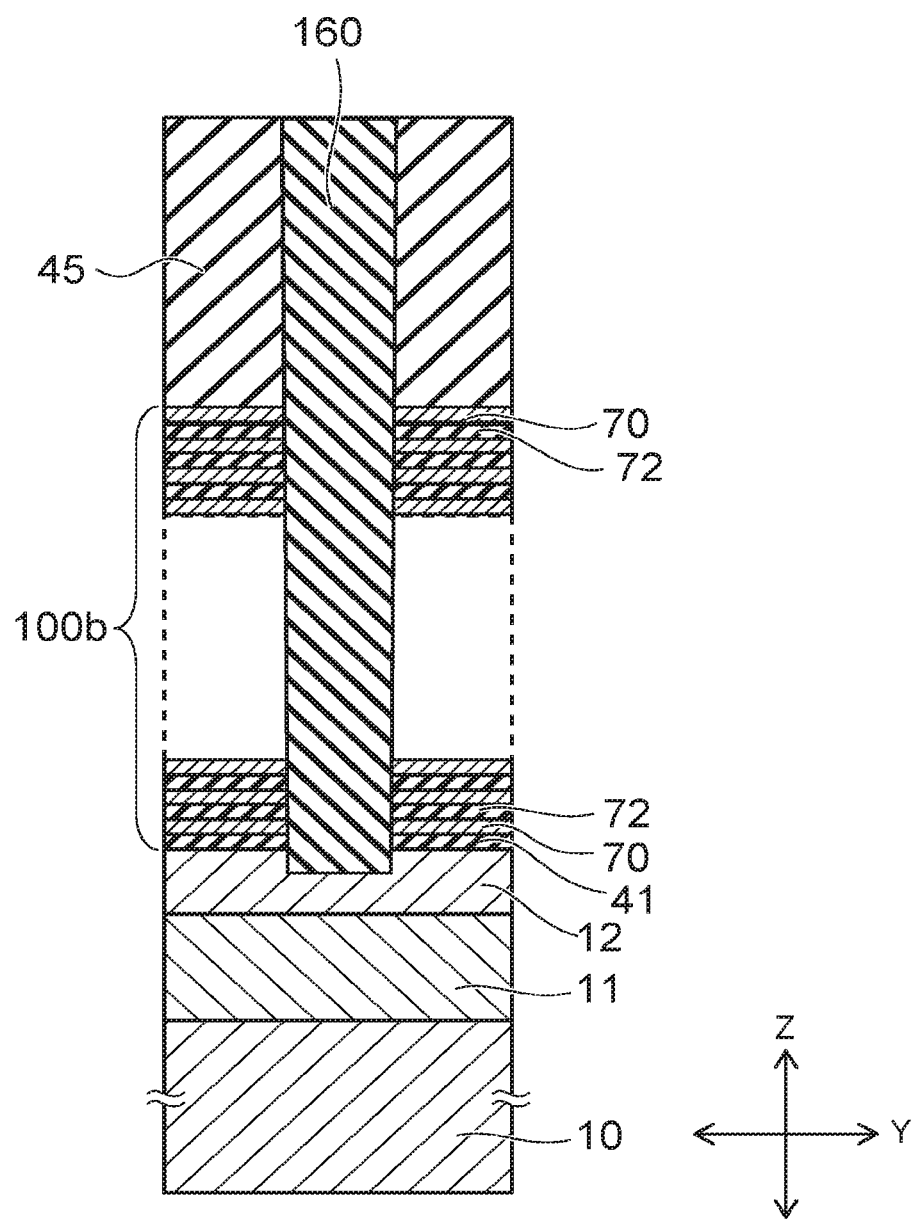
FIG. 40 is a schematic cross-sectional view showing another example of the memory cell array of the embodiment.

FIG. 40 is a schematic cross-sectional view along the Y-direction of the portion of the second stacked unit 100b where the separation portion 160 is provided. The separation portion 160 is an insulating film; and is not electrically connected to the electrode layers 70 and the second foundation layer 12. Accordingly, even in the case where there is no second insulating portion 85b such as that shown in FIG. 34 and FIG. 35, the semiconductor body 20 of the second columnar portion CL2 is not electrically connected to the separation portion 160 via the second foundation layer 12.

Between different blocks 200 divided in the Y-direction in which the potential control of the electrode layers 70 of the same layer is performed commonly between the blocks 200, the contact vias 91 of different blocks 200 may be shorted to each other via the second foundation layer 12 and the semiconductor bodies 20 of the second columnar portions CL2.

Figure 41:
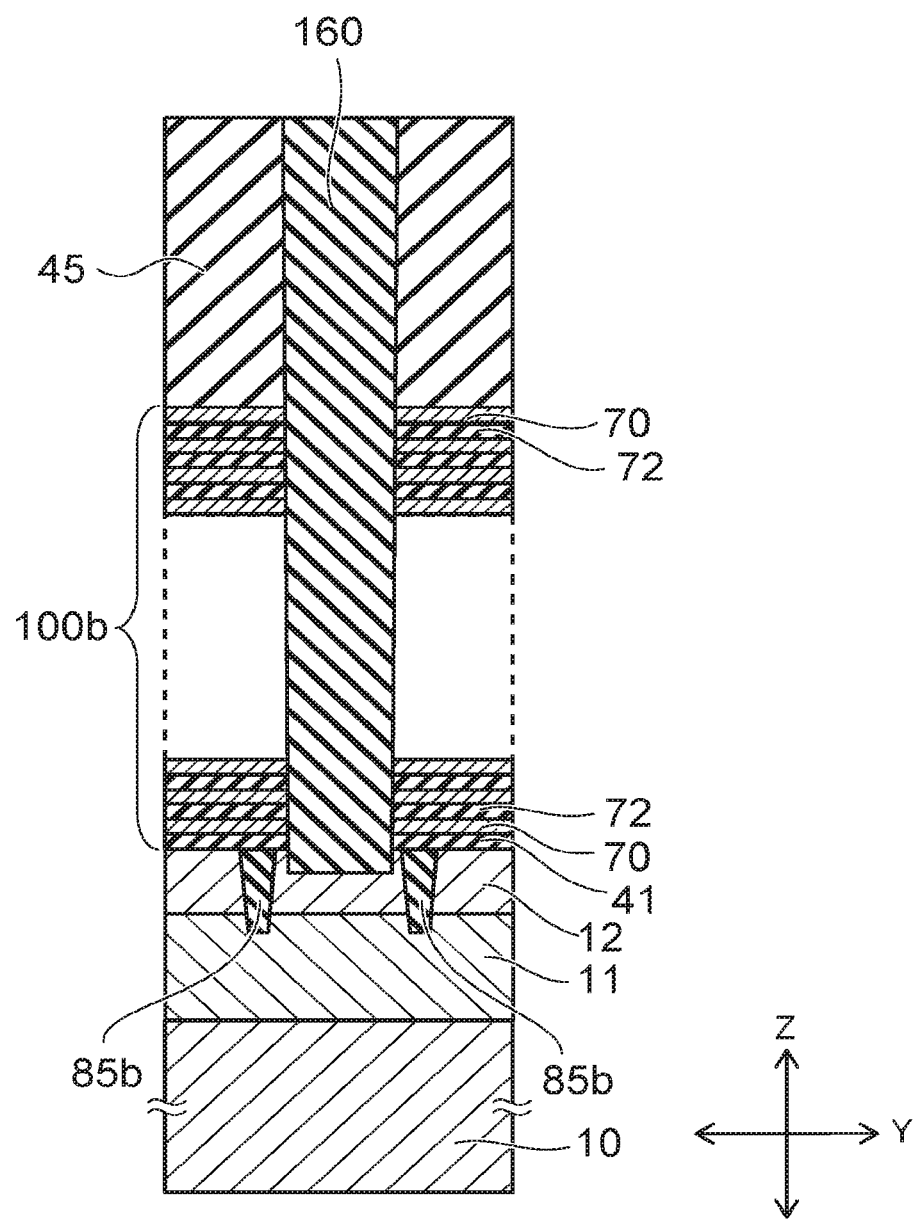
FIG. 41 is a schematic cross-sectional view showing another example of the memory cell array of the embodiment.

Between the blocks 200 in which the potential control of the electrode layers 70 of the same layer is performed separately, the second insulating portion 85b is provided as shown in FIG. 41. The second insulating portion 85b pierces the second foundation layer 12 and divides the second foundation layer 12 in the Y-direction. The second insulating portion 85b extends along the X-direction at a side of the lower end portion of the separation portion 160 contacting the second foundation layer 12. Or, the second insulating portion 85b may divide the second foundation layer 12 in the Y-direction below the separation portion 160.

The second insulating portion 85b prevents the shorts via the semiconductor bodies 20 and the second foundation layer 12 between the contact vias 91 of different blocks 200. Because it is sufficient for the second insulating portion 85b to break the electrical connection via the second foundation layer 12 between the different blocks 200, the second insulating portion 85b may not be formed at the side of the two sides of the separation portion 160 as shown in FIG. 41; and the second insulating portion 85b may be provided along the X-direction only at the side of one side of the separation portion 160. Also, the second insulating portion 85b may be provided with a width narrower than the separation portion 160 without completely covering the lower end portion of the separation portion 160 below the separation portion 160.

Also, in a structure in which the terrace portions 70a of different levels of the electrode layers 70 of different layers are adjacent in the Y-direction, the shorts via the semiconductor bodies 20 between the terrace portions 70a of the different levels adjacent to each other in the Y-direction can be prevented by providing the second insulating portion 85b dividing the active region 10a or the second foundation layer 12 in the Y-direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a foundation layer, the foundation layer being conductive or semiconductive;
   a stacked body provided above the foundation layer, the stacked body including a plurality of electrode layers stacked with an insulator interposed, the electrode layers including a first stacked unit and a second stacked unit, the second stacked unit having a plurality of terrace portions provided in a stairstep configuration with a difference in levels in a first direction;
   a plurality of first columnar portions including a first semiconductor body and a stacked film, the first semiconductor body extending in a stacking direction of the stacked body through the first stacked unit and contacting the foundation layer, the stacked film being provided between the first semiconductor body and the electrode layers, and including a charge storage portion;
   an insulating layer provided above the terrace portions;
   a plurality of contact vias extending in the stacking direction through the insulating layer and contacting the terrace portions; and
   a plurality of second columnar portions including a second semiconductor body and an insulating film, the second semiconductor body extending in the stacking direction through the second stacked unit, the insulating film being provided between the foundation layer and a lower end portion of the second semiconductor body, the second semiconductor body not electrically connecting to the foundation layer.

2. The semiconductor device according to claim 1, wherein the insulating film of the second columnar portion includes a stacked film of the same material as the stacked film of the first columnar portion.

3. The semiconductor device according to claim 1, wherein a thickness of the lower end portion of the second semiconductor body is thicker than a thickness of a lower end portion of the first semiconductor body.

4. The semiconductor device according to claim 1, wherein a diameter of a lower end portion of the second columnar portion is smaller than a diameter of a lower end portion of the first columnar portion.

5. The semiconductor device according to claim 1, wherein a diameter of an upper end portion of the second columnar portion is smaller than a diameter of an upper end portion of the first columnar portion.

6. The semiconductor device according to claim 1, wherein the second columnar portion extends in the stacking direction also inside the insulating layer.

7. The semiconductor device according to claim 1, wherein the plurality of first columnar portions is arranged more densely than the plurality of second columnar portions.

8. A semiconductor device, comprising:
a foundation layer, the foundation layer being conductive or semiconductive;
a stacked body provided above the foundation layer, the stacked body including a plurality of electrode layers stacked with an insulator interposed, the electrode layers including a first stacked unit and a second stacked unit, the second stacked unit having a plurality of terrace portions provided in a stairstep configuration with a difference in levels in a first direction;
a plurality of first columnar portions including a first semiconductor body and a stacked film, the first semiconductor body extending in a stacking direction of the stacked body through the first stacked unit and contacting the foundation layer, the stacked film being provided between the first semiconductor body and the electrode layers, and including a charge storage portion;
an insulating layer provided above the terrace portions;
a plurality of contact vias extending in the stacking direction through the insulating layer and contacting the terrace portions;
a plurality of second columnar portions including a second semiconductor body extending in the stacking direction through the second stacked unit and contacting the foundation layer; and
an insulating portion dividing the foundation layer under the second stacked unit into a plurality of regions in the first direction at a pitch corresponding to a pitch of the terrace portions.

9. The semiconductor device according to claim 8, further comprising a separation portion extending in the stacking direction and the first direction, and dividing the stacked body in a second direction intersecting the first direction.

10. The semiconductor device according to claim 9, wherein the insulating portion extends along the first direction under the separation portion, or at a side of a lower end portion of the separation portion.

11. The semiconductor device according to claim 10, wherein the separation portion includes an interconnect portion contacting the foundation layer and extending in the first direction inside the separation portion, the insulating portion being provided to cover a lower end portion of the interconnect portion, or provided at a side of two sides of the lower end portion of the interconnect portion.

12. The semiconductor device according to claim 8, wherein the insulating portion extends along a boundary of the terrace portions under the boundary.

13. The semiconductor device according to claim 9, wherein the insulating portion continuously surrounds the foundation layer under the terrace portions in the first direction and the second direction for every one terrace portion.

14. The semiconductor device according to claim 8, wherein
the contact vias includes:
a first contact via disposed in a first terrace portion of the terrace portions; and
a second contact via disposed in a second terrace portion adjacent to the first terrace portion at one side in the first direction, and
the insulating portion is provided at a position partitioning the foundation layer in the first direction between a second columnar portion disposed in the first terrace portion and a second columnar portion disposed in the second terrace portion, the second columnar portion disposed in the first terrace portion being positioned on the one side in the first direction of the first contact via, the second columnar portion disposed in the second terrace portion being positioned on the one side in the first direction of the second contact via.

15. The semiconductor device according to claim 8, wherein the second columnar portion extends into the insulating layer in the stacking direction.

16. The semiconductor device according to claim 8, wherein the plurality of first columnar portions is arranged more densely than the plurality of second columnar portions.

* * * * *